(12) United States Patent
Grave et al.

(10) Patent No.: US 12,289,106 B2
(45) Date of Patent: Apr. 29, 2025

(54) RANDOM MISMATCH COMPENSATION FOR HIGH FREQUENCY INJECTION LOCKING RING OSCILLATORS

(71) Applicant: QUALCOMM Incorporated, San Diego, CA (US)

(72) Inventors: Baptiste Grave, Shanagarry (IE); Robert David Froggatt, Cork (IE); Stefano Facchin, Cork (IE); Roi Naor, Cork (IE)

(73) Assignee: QUALCOMM INCORPORATED, San Diego, CA (US)

( * ) Notice: Subject to any disclaimer, the term of this patent is extended or adjusted under 35 U.S.C. 154(b) by 70 days.

(21) Appl. No.: 18/459,125

(22) Filed: Aug. 31, 2023

(65) Prior Publication Data
US 2025/0080089 A1 Mar. 6, 2025

(51) Int. Cl.
*H03K 3/03* (2006.01)
*H03K 5/26* (2006.01)
*H03K 5/00* (2006.01)

(52) U.S. Cl.
CPC ............ *H03K 3/0315* (2013.01); *H03K 5/26* (2013.01); *H03K 2005/00078* (2013.01)

(58) Field of Classification Search
CPC .................................................. H03K 3/0315
USPC ....................................................... 331/57
See application file for complete search history.

(56) References Cited

U.S. PATENT DOCUMENTS

| 5,563,554 | A | * | 10/1996 | Mizuno | .................... | H03K 3/03 331/25 |
| 9,444,435 | B1 | | 9/2016 | Monaco et al. | | |
| 10,284,211 | B2 | * | 5/2019 | Kim | .......................... | H03L 7/22 |
| 2021/0313992 | A1 | | 10/2021 | Parvizi et al. | | |

OTHER PUBLICATIONS

Chen Y-T., et al., "A 100-GB/s PAM-4 Voltage-Mode Transmitter With High-Resolution Unsegmented Three-Tap FFE in 40-nm Cmos", IEEE Solid-State Circuits Letters, IEEE, vol. 5, Aug. 26, 2022, XP011919612, pp. 218-221, section III. entitled "Building Blocks", p. 219-p. 221, figure 6.
International Search Report and Written Opinion—PCT/US2024/042729—ISA/EPO—Dec. 9, 2024.

* cited by examiner

*Primary Examiner* — Joseph Chang
(74) *Attorney, Agent, or Firm* — Loza & Loza, LLP

(57) ABSTRACT

An injection-locked oscillator includes a plurality of delay elements, two or more voltage control circuits, a phase comparator and a controller. The plurality of delay elements is connected in a loop and coupled to a global power supply. Each delay element has an input driven by a preceding stage and an output that drives a next stage. Each voltage control circuit couples one of the plurality of delay elements to the global power supply. The phase comparator is coupled to in-phase and quadrature outputs of the injection-locked oscillator. The controller is coupled to an output of the phase comparator and is configured to drive control inputs of the two or more voltage control circuits. The control input of each voltage control circuit determines a level of a voltage drop across the each voltage control circuit.

27 Claims, 15 Drawing Sheets

RANDOM MISMATCH COMPENSATION FOR HIGH FREQUENCY INJECTION LOCKING RING OSCILLATORS

TECHNICAL FIELD

The present disclosure generally relates to clock and data recovery circuits and, more particularly, to circuitry for generating multiple clock signals at different phases.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a serial communication link. In high-speed applications, timing of the operation of a SERDES may be controlled by multiple clock signals. The use of multiple increased frequency clock signals results in increased power consumption. Furthermore, the SERDES generally receives clock signals that have the same frequency but different phases. Performance, accuracy or reliability of the SERDES may depend on the phase relationships of the clock signals and drift or other variations in the phase relationships of clock signals can result in errors in received data. Therefore, there is an ongoing need for new techniques that provide reliable lower-power clock generation and calibration circuits for high-speed serial links.

SUMMARY

Certain aspects of the disclosure relate to systems, apparatus, methods and techniques for controlling and managing phase relationships in clock signals generated by an oscillator for use with a high frequency deserializer. Some aspects relate to a low-power, high-speed injection-locked oscillator architecture and its calibration circuits. The calibration circuit can compensate for phase or duty cycle errors during normal operations.

In various aspects of the disclosure, an injection-locked oscillator includes a plurality of delay elements, two or more voltage control circuits, a phase comparator and a controller. The plurality of delay elements is connected in a loop and coupled to a global power supply. Each delay element has an input driven by a preceding stage and an output that drives a next stage. Each voltage control circuit couples one of the plurality of delay elements to the global power supply. The phase comparator is coupled to in-phase and quadrature outputs of the injection-locked oscillator. The controller is coupled to an output of the phase comparator and is configured to drive control inputs of the two or more voltage control circuits. The control input of each voltage control circuit determines a level of a voltage drop across the each voltage control circuit.

In various aspects of the disclosure, an apparatus includes means for measuring a frequency of a clock signal generated by an injection-locked ring oscillator, means for determining whether the measured frequency matches to a target frequency defined for the injection-locked ring oscillator, means for adjusting a voltage drop across two or more voltage control circuits when the measured frequency does not match the target frequency, and a controller configured to calibrate a duty cycle or phase associated with in-phase and quadrature outputs of the injection-locked oscillator when the measured frequency matches the target frequency. Each voltage control circuit couples a delay element of the injection-locked oscillator to a global power supply.

In various aspects of the disclosure, a method for calibrating an injection-locked oscillator includes measuring a frequency of a clock signal generated by the injection-locked oscillator, determining whether the measured frequency matches to a target frequency defined for the injection-locked ring oscillator, adjusting a voltage drop across two or more voltage control circuits when the measured frequency does not match the target frequency, and calibrating a duty cycle or phase associated with in-phase and quadrature outputs of the injection-locked oscillator when the measured frequency matches the target frequency. Each voltage control circuit couples a delay element of the injection-locked oscillator to a global power supply.

In one aspect, at least two delay elements of the plurality of delay elements are directly coupled to the global power supply. In certain aspects, the controller is further configured to provide a multibit control signal to each of the two or more voltage control circuits. In one example, the multibit control signal may be configured based on a phase difference between the in-phase and quadrature outputs determined by the phase comparator. In another example, the multibit control signal may be configured based on an input received from the phase comparator indicating a duty cycle associated with the in-phase and quadrature outputs.

In certain aspects, an injection phase generation circuit may be configured to generate a plurality of injection clock signals from a reference clock signal. The injection phase generation circuit may include a delay circuit that provides two or more of the plurality of injection clock signals by delaying the reference clock signal by a duration configured by the controller. The injection phase generation circuit may include a poly-phase filter. The injection phase generation circuit may include one or more phase interpolators.

In one aspect, the controller is further configured to calibrate the global power supply to obtain a desired free-running frequency for the in-phase and quadrature outputs.

DETAILED DESCRIPTION

Figure 1:
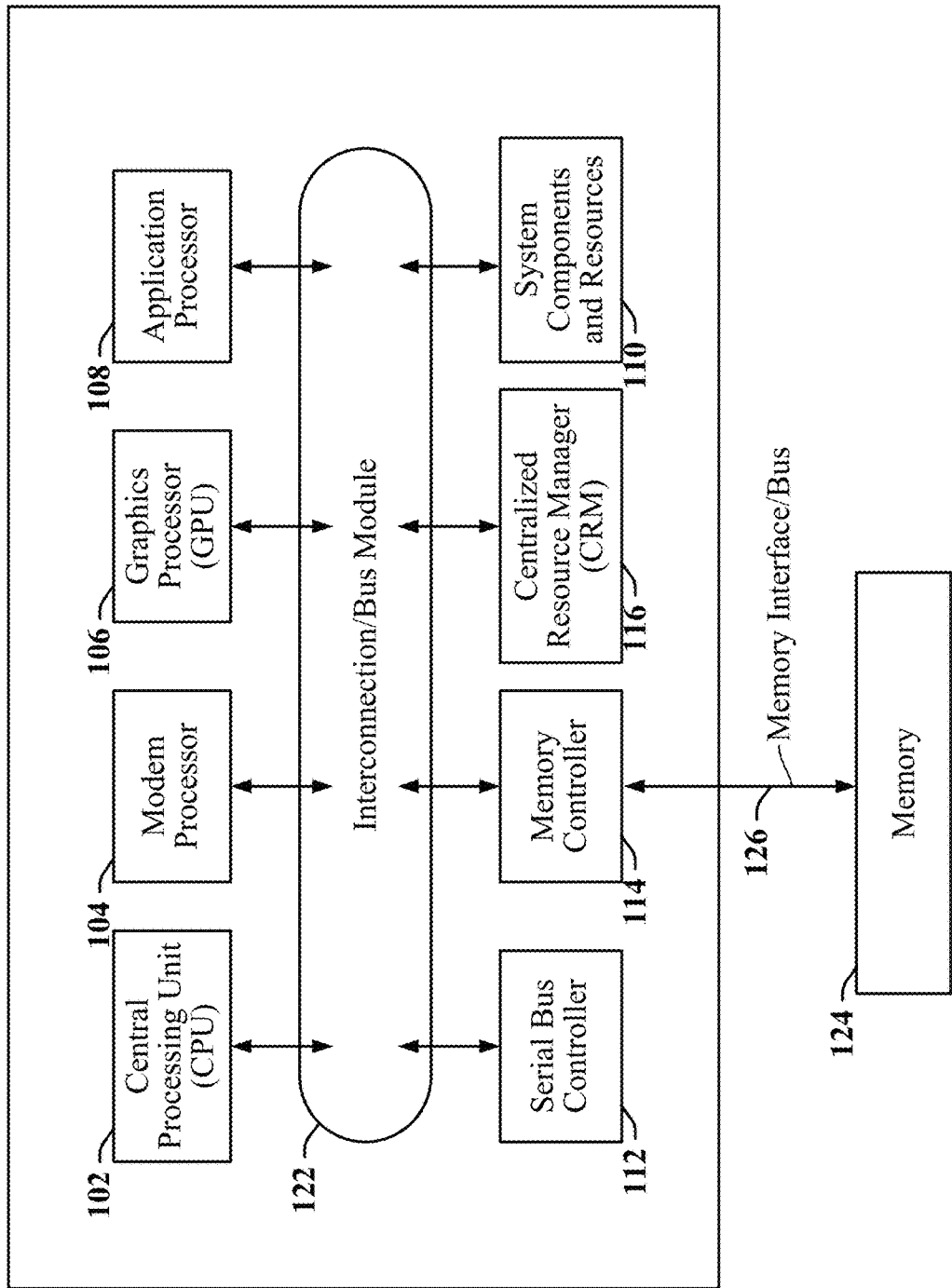
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single IC chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
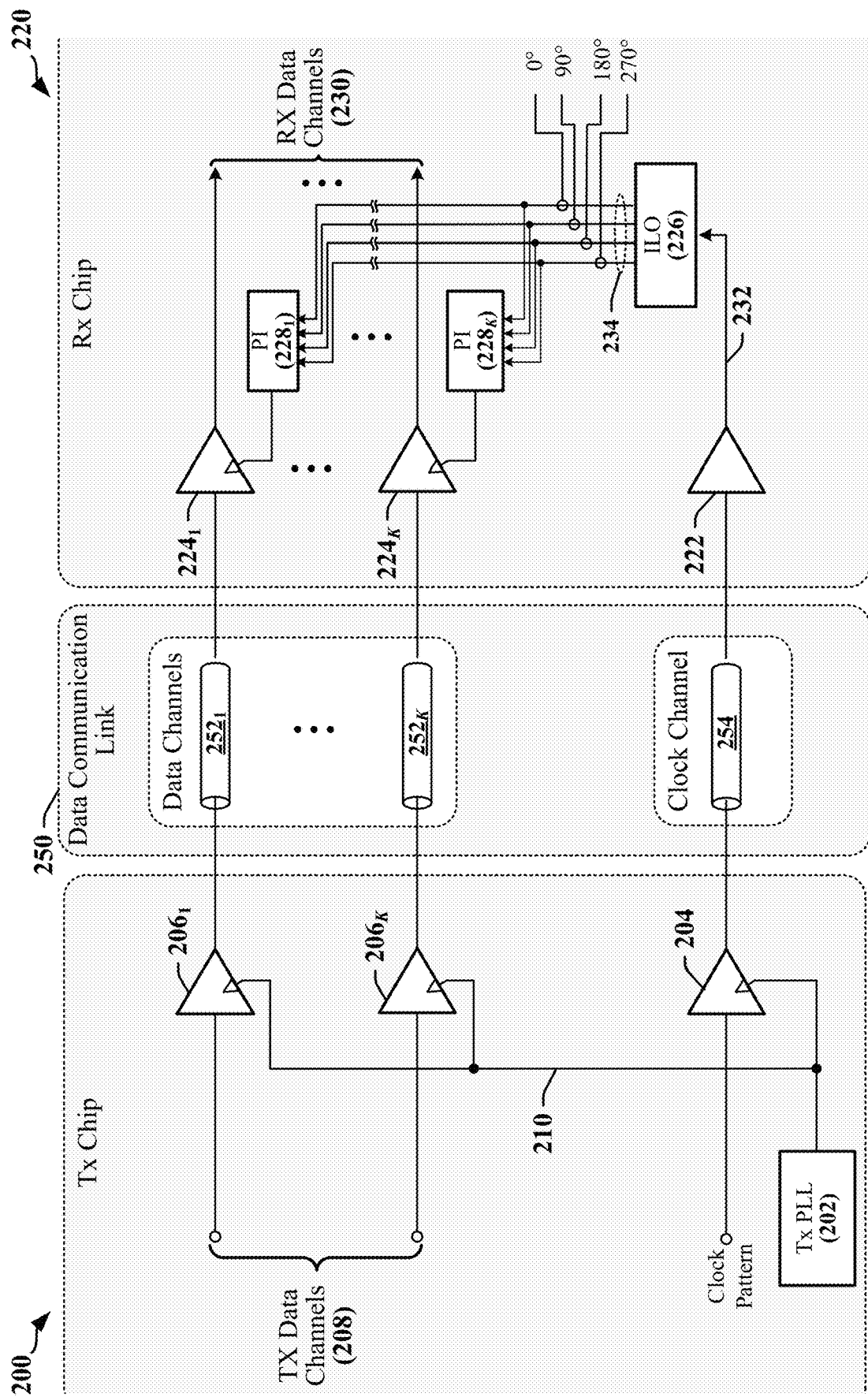
FIG. 2 illustrates an example of a system that employs a multi-channel data communication link.

FIG. 2 illustrates an example of a system that employs a multi-channel data communication link 250 to couple a transmitting device 200 with a receiving device 220. The data communication link 250 includes data channels $252_1$-$252_K$, 254 that provide a transmission medium through which signals propagate from a first device to a second device. In the illustrated example, the transmitting device 200 can be configured to transmit data signals over one or more data channels $252_1$-$252_K$ in accordance with timing information provided by a clock signal transmitted over a clock channel 254. The transmitting device 200 may include serializers (not shown) configured to convert parallel data into serial data for transmission over the data channels $252_1$-$252_K$. The transmitting device 200 further includes data drivers $206_1$-$206_K$ configured to generate data signals over the one or more data channels $252_1$-$252_K$ to the receiving device 220 through the data communication link 250 in accordance with timing information provided by a clock signal forwarded by a clock driver 204 over a clock channel 254.

Clock forwarding is common in communication systems, and provides the benefit that a phase locked loop (PLL) and other clock recovery circuits are not required in the receiving device 220. Long term jitter originating with a PLL 202 in the transmitting device 200 is transparent to the system. Typically, only one phase of the transmitter-generated clock signal is forwarded to conserve power and the space that would be occupied by additional clock channels. In some examples, multiple phases of the transmitter-generated clock signal are forwarded. In some examples, the transmitter-generated clock signal is forwarded as a differential clock signal.

The receiving device 220 may be configured to receive and process the data signals. The receiving device 220 may generate additional phases of the clock signal to obtain in-phase and quadrature (I/Q) versions of the clock signal to be used by phase interpolators $228_1$-$228_K$. A quadrature signal has phase that is shifted by 900 with respect to an in-phase signal. The phase interpolators $228_1$-$228_K$ may provide outputs that are phase-adjusted or phase-corrected I/Q versions of the clock signal. In one example, the outputs of each of the phase interpolators $228_1$-$228_K$ are provided to sampling circuits $224_1$-$224_K$.

The receiving device 220 may include an injection-locked oscillator (ILO) that receives the clock signal from a line receiver 222 coupled to the clock channel 254 and generates phase-shifted versions of the clock signal, including I/Q versions of the clock signal. Oscillators are fundamental building blocks of modern electronics and most often are implemented as ring oscillators (ROs), which can offer advantages over other types of oscillator including reduced area footprint, power efficiency and scalability with technological process.

Figure 3:
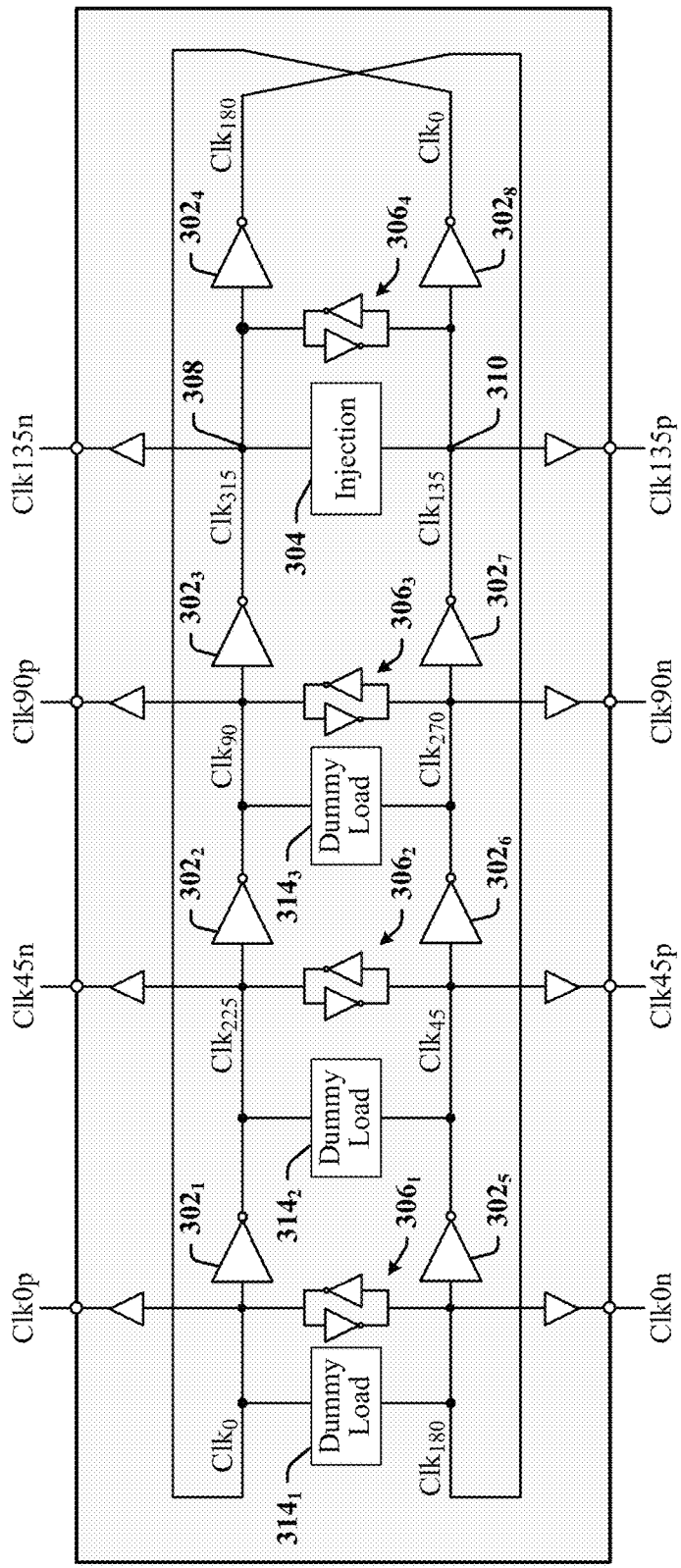
FIG. 3 illustrates an example of an injection-locked ring oscillator (ILO) that may be adapted in accordance with certain aspects of this disclosure.
Figure 4:
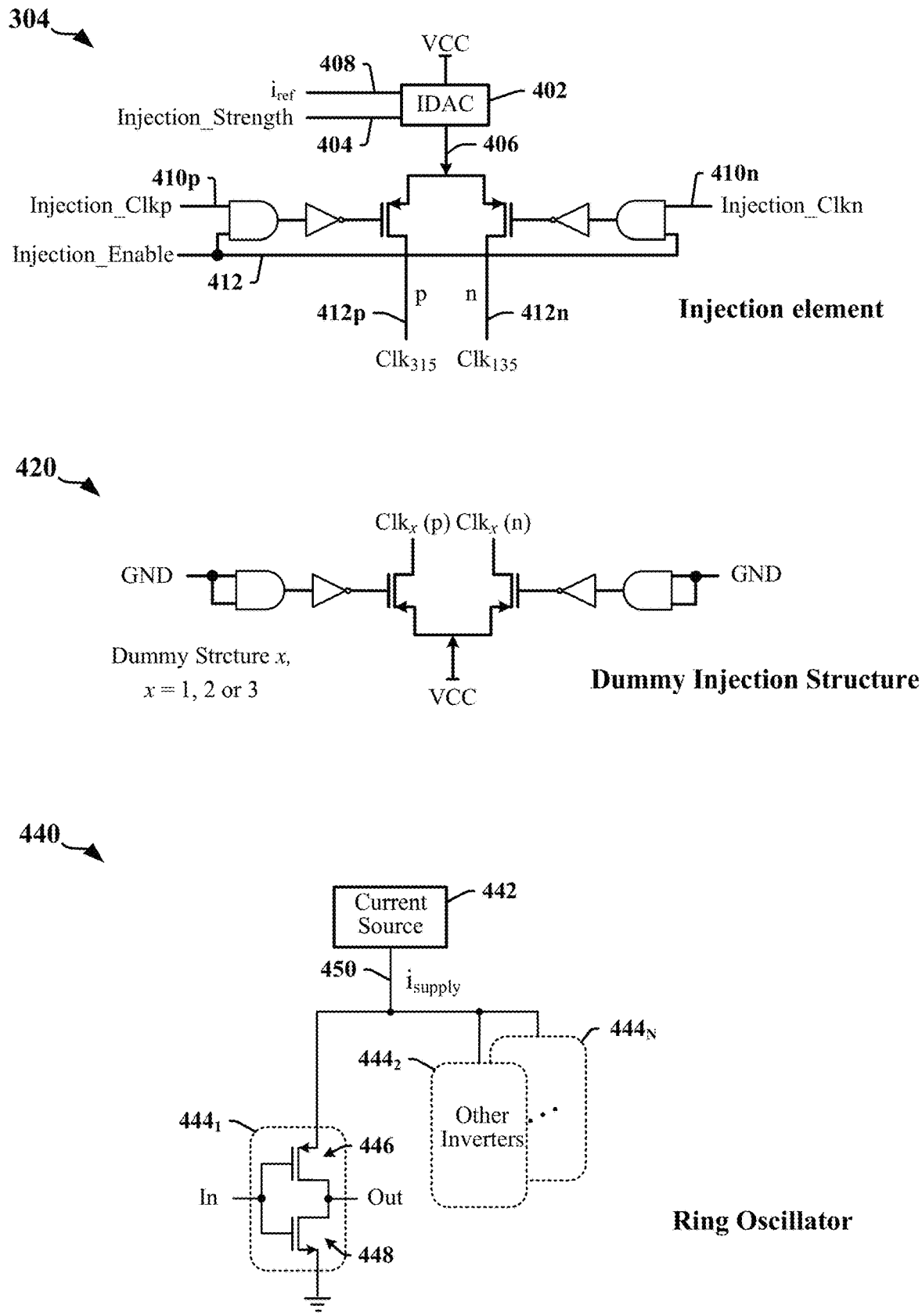
FIG. 4 illustrates an example of an injection element, an example of a ring oscillator and an example of a dummy injection structure that may be adapted in accordance with certain aspects of this disclosure.

FIG. 3 illustrates an example of an injection-locked ring oscillator (the ILO 300). The ILO 300 can be locked to an injected external signal that has a frequency near the operating frequency or free-running frequency of the ILO 300. The ILO 300 includes a number of stages $302_1$-$302_8$ connected in a loop. In one example, pairs of back-to-back inverters $306_1$-$306_4$ are provided to create sufficient phase shift between the stages $302_1$-$302_4$ and corresponding stages $302_5$-$302_8$ to create oscillation. The gain around the loop is equal to unity and the accumulated phase shift is equal to a multiple of 360°. In one example, each of the stages $302_1$-$302_8$ connected in a loop includes an inverter configured with an input driven by a preceding stage $302_1$-$302_8$ and an output that drives a next stage $302_1$-$302_8$. For an odd number of inverters n, the inverter's delay T sets the free-running oscillation frequency $f_0 = (2n\tau)^{-1}$, with phase difference between stages=360°/n. The ILO 300 provides multiple quadrature phases of the same clock. The illustrated ILO 300 is a ring oscillator that has an even number of stages $302_1$-$302_8$ and that can produce accurate quadrature phase outputs if a mode of oscillation (180° shift between each stage $302_1$-$302_8$) can be excited. An injection element 304 or a dummy load $314_1$-$314_3$ cross may be provided to couple each differential phase of the oscillator. This cross-coupling can be used to overcome direct current mode gain. With reference also to FIG. 4, a current digital-to-analog converter (the IDAC 402) in the injection element 304 provides an injection current 406 that is controlled by the value of an injection strength control input 404. In some instances, the ILO 300 may be implemented using a voltage-controlled RO. In some examples, the ILO 300 may be implemented using a current-starved RO in which a bias current or supply current is provided by a current source. In some examples, the bias current is provided by an IDAC (e.g., the IDAC 402 in FIG. 4). In comparison to voltage-controlled ROs, current-starved ROs can be more easily controlled over process-voltage and temperature (PVT) variations. The inclusion of an IDAC to control the bias current or supply current enables the ILO 300 to operate as a digitally controlled oscillator. This architecture can be exploited to inject timed bursts of current and lock the oscillator to a desired frequency.

In the example injection element 304 illustrated in FIG. 4, the IDAC 402 outputs a scaled version of a reference current 408 ($i_{ref}$) as an injection current 406. The injection current 406 is used to control the injection strength based on the value of an injection strength control input 404. The injection current 406 is injected alternatively to one phase or the other of the oscillator based on the input reference clock polarity 410p, 410n when the enable control signal 412 is high. In the illustrated example, the injection element 304 is coupled to a pair of nodes 308, 310 ($Clk_{315}$ and $Clk_{135}$) used for injection in the ILO 300.

Dummy loads $314_1$-$314_3$ are coupled to the other pairs of nodes: $Clk_0$ and $Clk_{180}$, $Clk_{225}$ and $Clk_{45}$ and $Clk_{90}$ and $Clk_{270}$. In some examples, the dummy loads $314_1$-$314_3$ can be implemented using the example dummy injection structure 420 shown in FIG. 4. The dummy injection structures 420 may be coupled to each of the other pairs of nodes in the ILO 300 for load matching purposes and to ensure that all phase delay elements have identical circuit elements.

FIG. 4 shows certain aspects of a ring oscillator 440 that may be adapted in accordance with certain aspects of this disclosure. The ring oscillator 440 includes a number (N) of inverters $444_1$-$444_N$ that receive a supply current 450 from a current source 442. The magnitude of the supply current 450 can be adjusted to tune the ring oscillator 440. A first inverter $444_1$ is illustrated as having a pair of transistors 446, 448, although other configurations and types of inverter may be used. The inverters $444_1$-$444_N$ may be arranged or configured to provide the ILO 300.

The ILO 300 may be configured to free run at a frequency close to a target frequency. In one example, the target frequency may be 10 GHz and the ILO 300 may be configured to free run at 9.9 GHz. When in a free-running mode, each stage $302_1$-$302_8$ contributes a delay of 12.6 picoseconds calculated as $f_0=(1/9.9\times10^9)/8=12.6$ ps. When injection locked, one of the stages $302_1$-$302_8$ is forced to switch faster, with a delay of 11.8 ps in the illustrated example. The overall locked frequency of oscillation ($f_{Lock}$) can be calculated as follows:

$$f_{Lock} = \frac{10^{12}}{((7\times 12.6) + 11.8)}Hz = \frac{10^{12}}{100}Hz = 10 \text{ GHz.}$$

The output signals can be generated using a differential input clock signal at the target frequency. The major portion of jitter in the output signals is inherited from the input clock signal rather than from the free running current controlled oscillator.

Figure 5:
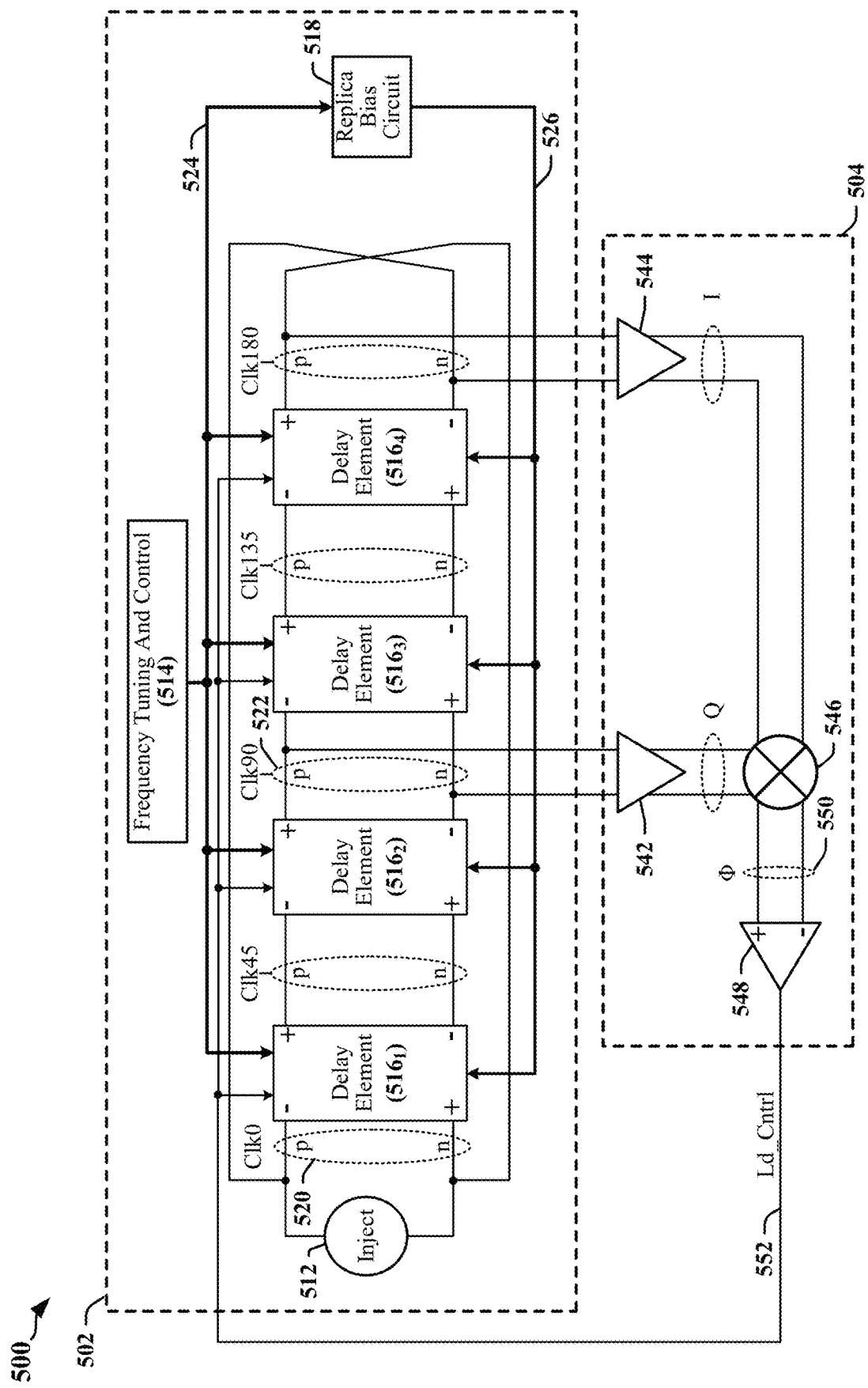
FIG. 5 illustrates an example of a quadrature calibrated oscillator circuit that may be adapted or configured according to certain aspects of this disclosure.

FIG. 5 illustrates an example of a quadrature calibrated oscillator circuit 500 that may be adapted or configured according to certain aspects of this disclosure. The quadrature calibrated oscillator circuit 500 includes an injection-locked ring oscillator 502 and an analog quadrature calibration circuit 504 in an analog quadrature calibration loop.

The injection-locked ring oscillator 502 includes four delay elements $516_1$-$516_4$ coupled in cascade with the output of the fourth delay element $516_4$ being inverted and fed back to the input of the first delay element $516_1$. In the illustrated example, the phase difference between the input of the first delay element $516_1$ and the output of the fourth delay element $516_4$ is 180°. The first delay element $516_1$ additionally receives an injection locking signal generated by a clock source 512. The delay elements $516_1$-$516_4$ may be regarded as differential circuits having differential signal inputs and differential signal outputs, as indicated by the "+" and "−" designators. The effect of the delay introduced by each one of the delay elements $516_1$-$516_4$ is to introduce a phase shift in the oscillating signal from stage to stage. In the illustrated example, the differential signal output by the first delay element $516_1$ has a 45° phase shift with respect to the input differential signal (Clk0 520) provided to the input of the first delay element $516_1$, the differential signal (Clk90 522) output by the second delay element $516_2$ has a 90° phase shift with respect to Clk0 520, the differential signal output by the third delay element $516_3$ has a 135° phase shift with respect to Clk0 520, and the differential signal output by the fourth delay element $516_4$ has a 180° phase shift with respect to Clk0 520. The differential signals output by the first delay element $516_1$ and the third delay element $516_3$ have a quadrature phase relationship (i.e., offset by 90°). The differential signal output by the second delay element $516_2$ and the fourth delay element $516_4$ also have a quadrature phase relationship.

The free-running frequency of the injection-locked ring oscillator 502 can be digitally tuned using a frequency tuning and control circuit 514 that provides a multibit control signal 524 to each of the delay elements $516_1$-$516_4$. In one example, the multibit control signal 524 selects or adjusts the delay provided by the delay elements $516_1$-$516_4$. The frequency tuning and control circuit 514 is used to configure the multibit control signal 524 in order to match the free-running frequency of the injection-locked ring oscillator 502 with the frequency of the injection locking signal generated by the clock source 512. The phases of the differential signals at the outputs of consecutive delay elements $516_1$-$516_4$ are offset by 45° when frequency match is accomplished. In operation, the relative phase error between consecutive delay elements $516_1$-$516_4$ is expected to be proportional to the difference between the free-running frequency of the injection-locked ring oscillator 502 and the frequency of the injection locking signal.

Digital calibration using the frequency tuning and control circuit 514 can accommodate process variations during initialization. However, recalibration using the frequency tuning and control circuit 514 is typically not available or feasible during normal operation of the quadrature calibrated oscillator circuit 500. Compensation for temperature and supply voltage variations may be provided through the use of the analog quadrature calibration circuit 504 after completion of digital calibration. Temperature and supply voltage variations can result in phase errors in the output signals. A bias replica circuit 518 receives the multibit control signal 524 provided by the frequency tuning and control circuit 514, and the output 526 of the bias replica circuit 518 is configured during digital calibration of the injection-locked ring oscillator 502.

Figure 6:
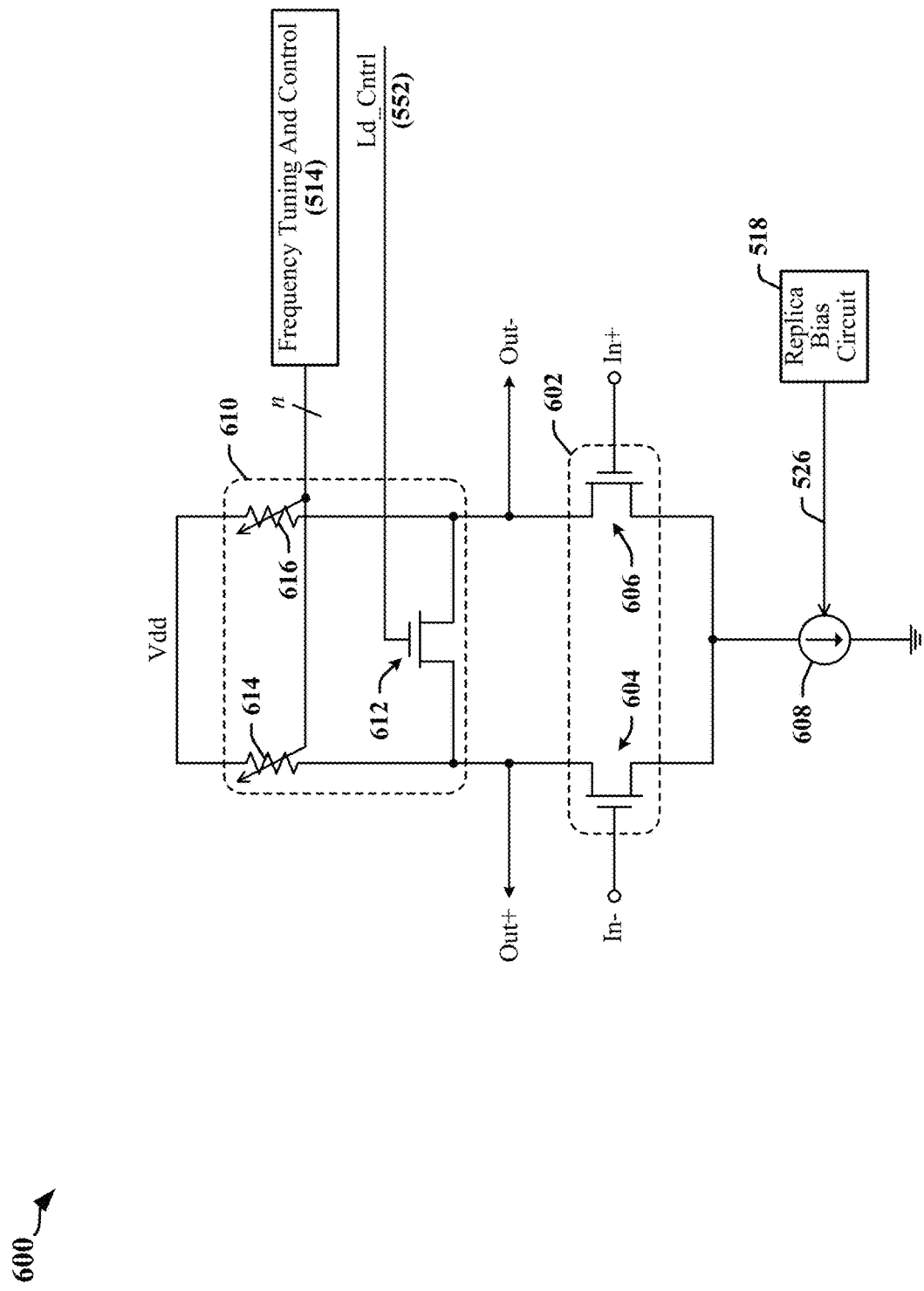
FIG. 6 illustrates an example of a delay element that may be used in the oscillator circuit illustrated in FIG. 5.

FIG. 6 illustrates an example of a delay element 600 that may be used to implement each of the delay elements $516_1$-$516_4$ illustrated in FIG. 5. The delay element 600 is used herein to illustrate the operation of the analog quadrature calibration circuit 504. Each delay element 600 includes a tail current source 608 that biases a differential input transistor pair 602. The bias provided by the tail current source 608 is controlled by the bias replica circuit 518, which responds to the multibit control signal 524 provided by the frequency tuning and control circuit 514. In the illustrated example, the tail current source 608 is coupled to a ground supply rail. The gate terminals for the transistors in the differential input transistor pair 602 provide the inverting and non-inverting input terminals (In− and In+) for the delay element 600. The non-inverting and inverting differential output terminals (Out+ and Out−) for the delay element 600 are provided at the drain terminals of the transistors in the differential input transistor pair 602.

In the illustrated example, a variable load circuit 610 is coupled to the differential input transistor pair 602. The variable load circuit 610 includes a first variable resistance 614 coupled in series with transistor 604 in the differential input transistor pair 602 and a second variable resistance 616 coupled in series with transistor 606 in the differential input transistor pair 602. The variable resistances 614, 616 are coupled to a supply rail (Vdd). The multibit control signal 524 provided by the frequency tuning and control circuit 514 provides an n-bit control word that may be used to select, adjust or otherwise control the resistance provided by the variable resistances 614, 616. In one example, each variable resistance 614, 616 may be implemented using n MOS transistors that are gated by one of the bits in the n-bit control word.

The variable load circuit 610 further includes a load transistor 612 whose source-drain circuit path is coupled between the drain terminals of the differential input transistor pair 602. The gate terminal of the load transistor 612 receives a control signal (the Ld_Cntrl signal 552) provided by the analog quadrature calibration circuit 504. The gate voltage modulates the conductivity of the load transistor 612, effectively implementing a variable resistance coupled between the drain terminals of the differential input transistor pair 602. The variable resistance provided by the load transistor 612 can be varied in real-time during operation of the quadrature calibrated oscillator circuit 500. Modifying the resistance provided by the load transistor 612 changes the resistance of the variable load circuit 610, the delay provided by the delay element 600, and ultimately the frequency of the free-running frequency of the injection-locked ring oscillator 502 and/or the phase difference between signals output by the delay elements $516_1$-$516_4$ in the quadrature calibrated oscillator circuit 500.

The analog quadrature calibration circuit 504 includes buffer circuits 542 and 544 that provide a quadrature-phase signal (Q) and an in-phase signal (I), respectively. In the illustrated example, the quadrature-phase signal is generated from the output of the second delay element $516_2$ and the in-phase signal is generated from the output of the fourth delay element $516_4$. The buffer circuits 542, 544 decouple the core circuits of the injection-locked ring oscillator 502 from the analog quadrature calibration circuit 504. It will be noted that the quadrature-phase signal and the in-phase signal are differential signals that have a quadrature phase relationship with respect to each other. While quadrature-related phases are used for the purpose of this description, it should be appreciated that certain concepts disclosed herein are applicable to other combinations of phases or phase relationships.

The analog quadrature calibration circuit 504 includes a phase detector circuit that includes a mixer circuit 546 that is configured to mix the quadrature-phase signal and in-phase signal signals (Q and I) output by delay elements $516_2$ and $516_4$. The mixer circuit 546 generates a phase difference signal 550 that represents the phase difference ($\Phi$) between the quadrature-phase signal and the in-phase signal. In the illustrated example, the phase difference signal 550 has a differential magnitude that is a function of $\Phi$. The quadrature-phase signal and the in-phase signal have the same frequency and the phase difference signal 550 can be expected to be a direct current signal that can indicate the presence and/or magnitude of a quadrature phase error between the quadrature-phase signal and the in-phase signal. The phase detector circuit includes a transimpedance amplifier 548 that converts the phase difference signal 550 to a control voltage of the Ld_Cntrl signal 552. The Ld_Cntrl signal 552 is provided to each of the delay elements $516_1$-$516_4$, thereby completing a feedback loop. In one example, the Ld_Cntrl signal 552 controls or adjusts the load provided by the variable load circuit 610 during operation of the injection-locked ring oscillator 502.

The digital and analog calibration circuits employed in the quadrature calibrated oscillator circuit 500 illustrated in FIG. 5 offer global control. As used herein, the term "global control" refers to a system in which all of the delay elements $516_1$-$516_4$ are collectively calibrated as a group. Calibration codes and adjustment signals are generated by the digital and analog calibration circuits and are applied equally to all delay elements $516_1$-$516_4$ in the injection-locked ring oscillator 502. These digital and analog calibration circuits are generally not able to calibrate, compensate or otherwise accommodate systematic mismatches between the delay elements $516_1$-$516_4$.

Certain examples of circuits depicted herein are implemented using P-type metal-oxide-semiconductor (PMOS) transistors, N-type metal-oxide-semiconductor (NMOS) transistors or some combination of NMOS and PMOS transistors. These examples are provided by way of example only, and it is contemplated that the concepts disclosed herein can be implemented in circuits that use various combinations of NMOS and PMOS transistors.

Figure 7:
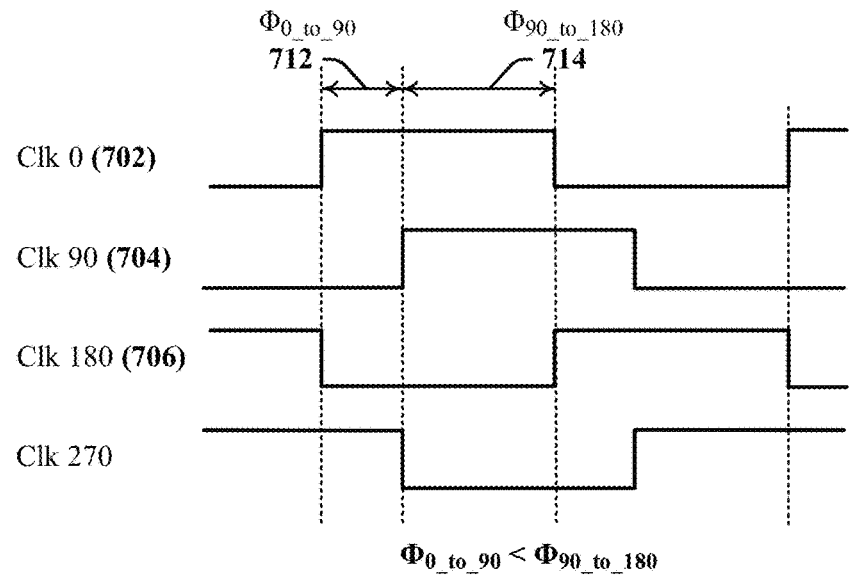
FIG. 7 illustrates examples of ILO calibration timing diagrams.
Figure 7:
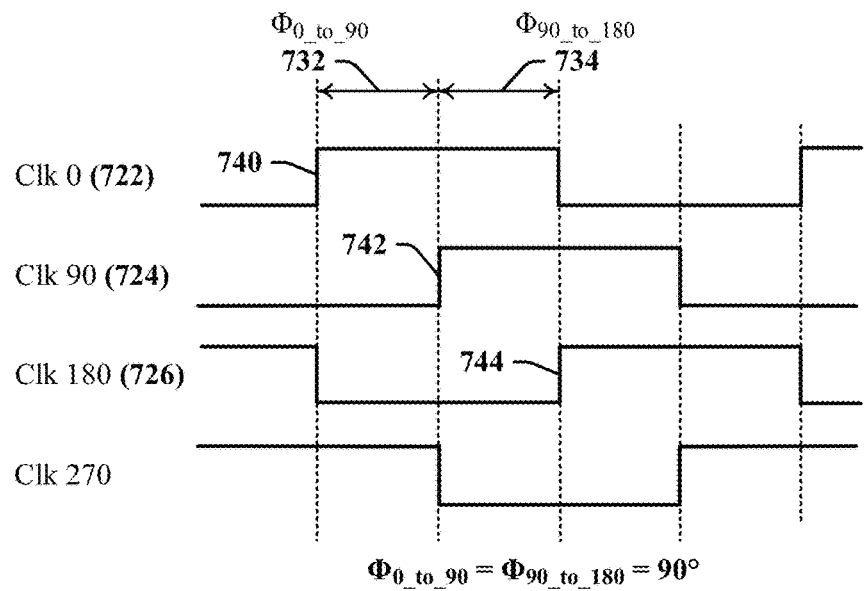

FIG. 7 illustrates certain limitations of conventional ILO calibration techniques, including the limitations associated with digital and analog calibration circuits employed in conventional ILOs. In the quadrature calibrated oscillator circuit 500 illustrated in FIG. 5, the phase of Clk0 520 (and Clk180) is effectively fixed by injection locking, while the phase of Clk90 522 may drift or otherwise vary with respect to the phase of Clk0 520 when the delay through one or more delay elements $516_1$-$516_4$ changes during operation. PVT variations can alter the duration of the delay provided by a delay element $516_1$-$516_4$. For example, the phase of Clk90 522 may vary when the delay through one or more delay elements $516_1$-$516_4$ changes based on PVT variations affecting certain tuning parameters, including the voltage or current provided by the power supply of the quadrature calibrated oscillator circuit 500.

A first timing diagram 700 illustrates an example in which mismatches in delays through delay elements $516_1$-$516_4$ result in a phase difference 712 ($\Phi_{0\_to\_90}$) between the quadrature-phase signal (Clk90 704) and the in-phase signal (Clk0 702) that is less than the phase difference 714 ($\Phi_{90\_to\_180}$) between the quadrature-phase signal (Clk90 704) and the 180° signal (Clk180 706) when the delay through one or more delay elements $516_1$-$516_4$ vary. The non-matching phase differences 712, 714 result in a duty cycle that is not equal to 50%. The duty cycle error stated as a percentage ($E_{DC}$) may determine the phase error ($\Phi_{err}$) in the phase difference 712 ($\Phi_{0\_to\_90}$) between the quadrature-phase signal (Clk90 704) and the in-phase signal (Clk0 702):

$$\Phi_{err} = E_{DC} \times \frac{360}{2}.$$

A second timing diagram 720 illustrates an example when the phase difference 732 ($\Phi_{0\_to\_90}$) between the quadrature-phase signal (Clk90 724) and the in-phase signal (Clk0 722) is equal to the phase difference 734 ($\Phi_{90\_to\_180}$) between the quadrature-phase signal (Clk90 724) and the 180° signal (Clk180 726).

The accuracy of the phase difference between the quadrature-phase signal and the in-phase signal can determine operational limits of a SERDES interface. Data transmission and data recovery circuits rely on the accuracy of the phase difference between the quadrature-phase signal and the in-phase signal to enable maximum data throughput to be achieved. The phase difference between the quadrature-phase signal and the in-phase signal may be stated as the variation from a nominal 90° phase difference. The 90° phase difference can be obtained when an exact 50% duty cycle is maintained. A 50% duty cycle requires that edges 742 in Clk90 724 are centered between corresponding edges 740, 744 in Clk0 722 and Clk180 726 as shown in the second timing diagram 720.

For the purpose of this disclosure, a term such as "phases of a 5 GHz clock signal" refers to signals derived from the 5 GHz clock signal that differ from one another in phase shift. In another example, the term "phases of a 10 GHz clock signal" refers to signals derived from the 10 GHz clock signal that differ from one another in phase shift.

In many systems, oscillators are expected to produce high frequency clock signals while operating at low power levels. These and other expectations can be met through the use of circuits constructed from small devices. The use of small devices in ILOs and other components that employ matched circuits can result in high mismatch contributions. In an ILO the resulting systematic mismatch can exhibit in phase errors and/or duty cycles that drift from 50%. As technology advances to accommodate increasing demands for higher frequencies, systematic mismatches can be expected to become more problematic.

Certain aspects of this disclosure relate to the compensation of systematic mismatches in high frequency injection locking ring oscillators that can occur during normal operations. Certain compensation circuits disclosed herein can dynamically recalibrate an injection locking ring oscillator when, for example, different delay elements are affected differently by voltage and temperature variations. Duty cycle correction can be implemented inside the ring oscillator without the need for external hardware circuits. In one example, duty cycle correction may be employed to calibrate or recalibrate the ILO in order to reduce or eliminate systematic mismatches including, for example, mismatched delays affecting two or more of the delay elements or stages in the ILO. In some implementations, calibration of in-phase and quadrature (IQ) output signals can be provided within the ILO. In some examples, multiple injection phases are provided to the ILO to facilitate IQ calibration.

In accordance with certain aspects of this disclosure, power supply in an injection locking ring oscillator may be localized and controlled for individual circuits. In some implementations, run time calibration can include varying the voltage and/or current level of the power supply provided to a delay element in order to modify the delay associated with the delay element. In certain implementations, duty cycle of a clock signal produced by an injection locking ring oscillator can be optimized by independently controlling the voltage at which power is supplied to each of two or more delay elements.

Figure 8:
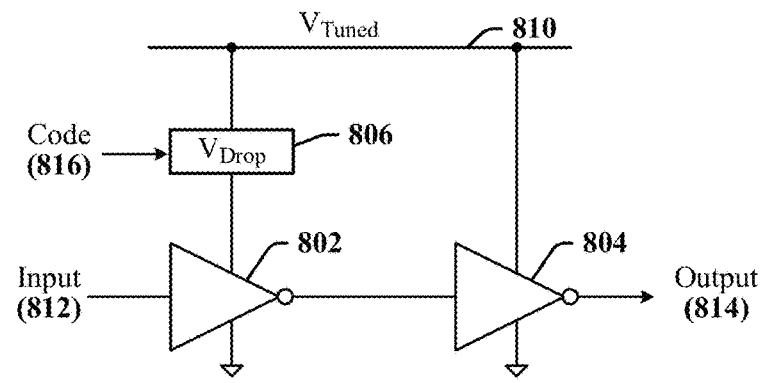
FIG. 8 illustrates an example of a duty cycle control circuit in an injection locking ring oscillator that is configured in accordance with certain aspects of this disclosure.
Figure 8:
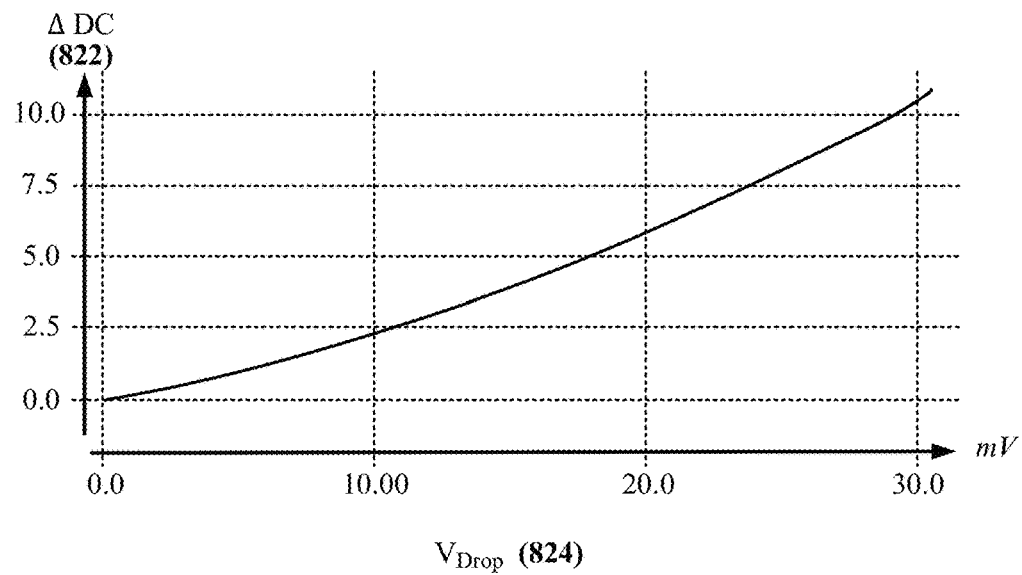

FIG. 8 illustrates certain aspects of power supply configuration that can be used to control duty cycle in an injection locking ring oscillator that is configured in accordance with certain aspects of this disclosure. In the circuit 800, power supplies in an injection locking ring oscillator can be localized and configured or adjusted to manage duty cycle of a clock signal generated by the injection locking ring oscillator. In the illustrated example, a first inverting delay element 802 receives an input clock signal 812. The output of the first inverting delay element 802 is coupled to the input of a second inverting delay element 804, which provides an output clock signal 814. The inverting delay elements 802, 804 can be expected to introduce delays of the same duration when proximately located on an IC device and when powered from the same power supply. In the illustrated example, a voltage control circuit 806 couples the first inverting delay element 802 to a rail 810 of a tuned power supply. The power supply may be tuned to determine or obtain a voltage level for the rail 810 that produces a desired free-running frequency for the injection locking ring oscillator. In the illustrated example, the second inverting delay element 804 is coupled directly to the rail 810 of the tuned power supply.

The voltage control circuit 806 may be configured to adjust a voltage drop between a power input of the first inverting delay element 802 and the rail 810 of the tuned power supply. In one example, the voltage control circuit 806 is configured using an input code 816 that is determined based on a detected or measured duty cycle error in the output clock signal 814. The voltage control circuit 806 can be used to cause the inverting delay elements 802, 804 to be operated at different voltage levels and to produce delays of different duration. In some implementations, a second voltage control circuit (not shown) may be provided to couple the second inverting delay element 804 to the rail 810 of the tuned power supply, thereby enabling duty cycle to be increased or decreased. In some implementations, the power input of the first inverting delay element 802 may be directly coupled to the rail 810 and a voltage control circuit (not shown) may be provided to couple the second inverting delay element 804 to the rail 810, thereby enabling duty cycle to be adjusted by modifying the delay provided by the second inverting delay element 804.

FIG. 8 includes a graph 820 that shows the variation of change in duty cycle 822 by voltage drop 824 introduced by the voltage control circuit 806. In some implementations, voltage drops may be introduced to the supply of inverters at specified, predefined or desired stages within an injection locking ring oscillator to obtain targeted duty cycle correction.

In some implementations, voltage control circuits may be implemented using PMOS transistors. Voltage control circuits implemented using PMOS transistors can provide consistent performance when PVT variations affect the oscillator core. For example, process and/or temperature variations affecting an ILO may cause a delay element of the ILO to sink increased current. The on resistance of PMOS transistors in a corresponding voltage control circuit drops should current flow increase, and the voltage control circuit can be configured to produce a stable voltage drop for a wide range of PVT variations.

The concepts disclosed herein can be applied to the injection-locked ring oscillators illustrated in FIGS. 3 and 5 when these injection-locked ring oscillators have been adapted or configured in accordance with certain aspects of this disclosure. The concepts disclosed herein can be applied to other types of injection-locked ring oscillators that have been adapted or configured in accordance with certain aspects of this disclosure. The concepts disclosed herein can be applied to certain circuits included in injection-locked ring oscillators to improve the operation of the injection-locked ring oscillators in some manner. In one example, an injection-locked ring oscillator may include a subordinate feedback loop that couples the output of a delay element to an input of a preceding delay element. In another example, an injection-locked ring oscillator may be provided with a feedforward path that couples the output of a first delay element to an input of a second delay element, bypassing one or more other delay elements in the forward path between the first and second delay elements. Certain concepts disclosed herein can be applied to compensate for mismatches or variances affecting delay elements associated with subordinate feedback loops or feedforward paths. Certain concepts disclosed herein may be applicable to other types of injection-locked ring oscillators or to injection-locked ring oscillators that include these additional or different adaptations.

Figure 9:
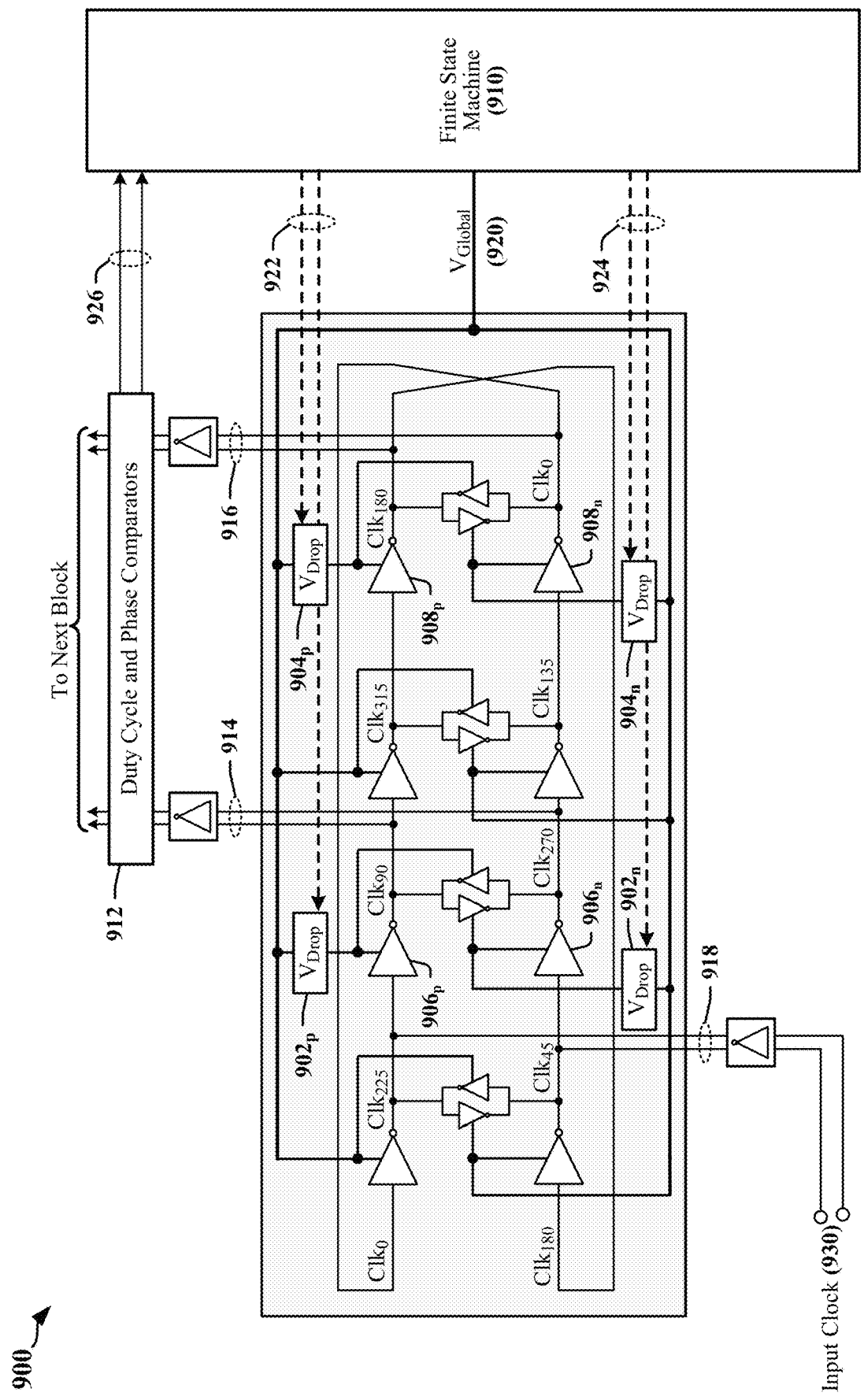
FIG. 9 illustrates a first example of an ILO that supports quadrature calibration and dynamic run-time recalibration in accordance with certain aspects of this disclosure.

FIG. 9 illustrates a first example of an ILO 900 that supports quadrature calibration and dynamic run-time recalibration in accordance with certain aspects of this disclosure. The ILO 900 corresponds in some respects to the quadrature calibrated oscillator circuit 500 illustrated in FIG. 5. In some implementations, the free-running frequency of the ILO 900 may be digitally tuned using the equivalent of the frequency tuning and control circuit 514 illustrated in FIG. 5, and may include the equivalent of the analog quadrature calibration circuit 504 illustrated in FIG. 5. The ILO 900 may be calibrated to have an operating frequency or free-running frequency that is locked to a two-phase injected clock signal 918, which may be derived from a reference clock signal 930. Initial calibration may ensure that the duty cycle of an in-phase output signal 916 and a quadrature output signal 914 does not vary from 50% by more than a predefined maximum duty cycle error.

The ILO 900 includes voltage control circuits $902_p$, $902_n$, $904_p$ and $904_n$ that couple the power supply inputs of corresponding delay elements $906_p$, $906_n$, $908_p$ and $908_n$ to a global power supply 920. For the purposes of this description, the term global power supply refers to a power supply that has a calibrated voltage and that is used to power all delay elements within the ILO 900. In the illustrated example, the voltage of the global power supply 920 is calibrated and/or controlled by a finite state machine 910. The voltage of the global power supply 920 may be tuned during initial system calibration in order to obtain a desired free-running frequency of the ILO 900 and/or an acceptable duty cycle of the in-phase output signal 916 and quadrature output signal 914. In the illustrated example, the finite state machine 910 provides multibit codewords 922, 924 that define the voltage drop across each of the voltage control circuits $902_p$, $902_n$, $904_p$ and $904_n$. The finite state machine 910 may configure the multibit codewords 922, 924 based on signaling 926 provided by duty cycle and phase comparators circuit 912. The duty cycle and phase comparators circuit 912 may be configured to monitor and/or measure characteristics of the in-phase output signal 916 and quadrature output signal 914 that can be used to determine phase relationships and duty cycles between and within the in-phase output signal 916 and quadrature output signal 914.

In some implementations, the duty cycle and phase comparators circuit 912 and the finite state machine 910 may cooperate to measure the elapsed time between edges in the in-phase output signal 916 and quadrature output signal 914. In one example, elapsed time information may indicate the phase relationship of the edges in the in-phase output signal 916 and quadrature output signal 914 with respect to an edge in the in-phase output signal 916, for instance. In another example, elapsed time information may provide sufficient information to calculate the duty cycles of the in-phase output signal 916 and quadrature output signal 914 or a variation from a 50% duty cycle in the in-phase output signal 916 and quadrature output signal 914.

In some implementations, the finite state machine 910 may adjust phases or duty cycles associated with the in-phase output signal 916 and quadrature output signal 914 by incrementing or decrementing the value of one or more of the multibit codewords 922, 924. In some implementations, the finite state machine 910 may adjust phases or duty cycles associated with the in-phase output signal 916 and quadrature output signal 914 by selecting values for one or more of the multibit codewords 922, 924 from a lookup table that may be indexed based on information provided in the signaling 926 obtained from the duty cycle and phase comparators circuit 912.

In some implementations, the finite state machine 910 may monitor or control the voltage of the global power supply 920. Local supplies may be configured and/or provided for each of a group of delay elements provided in the ILO 900. In the example illustrated in FIG. 9, a group of four delay elements $906_p$, $906_n$, $908_p$, $908_n$ receive power from the global power supply 920 through the voltage control circuits $902_p$, $902_n$, $904_p$ and $904_n$, while other delay elements receive power directly from the global power supply 920. In other examples, each delay element provided in the ILO 900 receives independent localized power from the global power supply 920 through a corresponding voltage control circuit, enabling maximum control over phase and duty cycle. The finite state machine 910 may be configured to control the voltage drops provided by voltage control circuits, including the voltage control circuits $902_p$, $902_n$, $904_p$ and $904_n$, to correct systematic duty cycle errors in clock signals produced by the ILO 900 and/or to correct phase mismatches within the ILO 900.

In the example illustrated in FIG. 9, the core circuits of the ILO 900 are used to control noise rejection bandwidth and phase errors occurring between the in-phase output signal 916 and quadrature output signal 914. These phase errors can originate due to PVT variations that can alter the duration of delays provided by the delay elements $906_p$, $906_n$, $908_p$, $908_n$. The phase of edges in the in-phase output signal 916 with respect to the two-phase injected clock signal 918 is effectively fixed due to injection locking, while the phase of edges in the quadrature output signal 914 may drift or otherwise vary with respect to the two-phase injected clock signal 918 when the delay through one or more of the delay elements $906_p$, $906_n$, $908_p$, $908_n$ changes during operation. Phase errors may be reduced or eliminated by modifying the delays associated with the delay elements $906_p$, $906_n$, $908_p$, $908_n$. Modifying the delay elements $906_p$, $906_n$, $908_p$, $908_n$ can affect the noise rejection bandwidth of the ILO 900.

Figure 10:
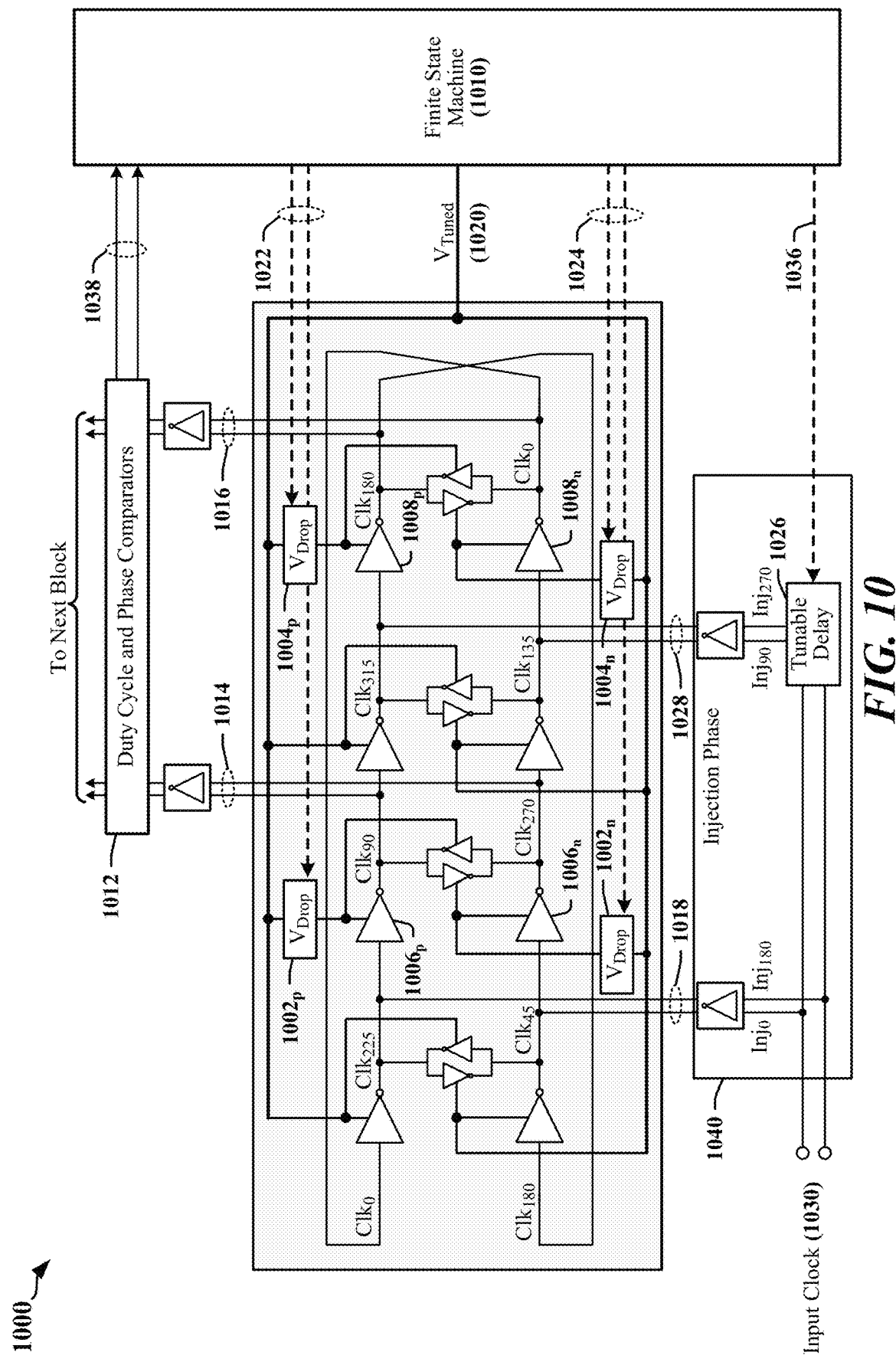
FIG. 10 illustrates a second example of an ILO that supports quadrature calibration and dynamic run-time recalibration in accordance with certain aspects of this disclosure.

FIG. 10 illustrates a second example of an ILO 1000 that supports quadrature calibration and dynamic run-time recalibration in accordance with certain aspects of this disclosure. In this example, four-phase injection is provided in the ILO 1000. The ILO 1000 may be configured to separate control of noise rejection bandwidth from control of phase errors occurring between an in-phase output signal 1016 and a quadrature output signal 1014. Certain systematic phase mismatches in the ILO 1000 may remain uncorrected by the core circuits of the ILO 1000 and may produce phase errors between the in-phase output signal 1016 and the quadrature output signal 1014. The effects of these systematic phase mismatches can be reduced or eliminated by adjusting a tunable delay that defines the phase angle between an in-phase differential injection signal 1018 and a quadrature differential injection signal 1028 provided by an injection phase generation circuit 1040. In one example, systematic phase mismatches in the ILO 1000 may produce a +3° phase error between the in-phase output signal 1016 and the quadrature output signal 1014. The ILO 1000 may be designed or configured such that phase errors between the in-phase differential injection signal 1018 and the quadrature differential injection signal 1028 are attenuated by a factor of 10 in the phase angle between the in-phase output signal 1016 and the quadrature output signal 1014. In this example, the tunable delay may be configured to introduce a −30° phase correction in the phase angle between the in-phase differential injection signal 1018 and the quadrature differential injection signal 1028. In this example, the phase angle between the in-phase differential injection signal 1018 and the quadrature differential injection signal 1028 is set to 60°. The −30° phase correction is attenuated by a factor of 10 and the resultant −3° attenuated phase correction cancels the +3° phase error produced by the systematic phase mismatches in the ILO 1000 and produces a 90° phase angle between the in-phase output signal 1016 and the quadrature output signal 1014.

The ILO 1000 corresponds in some respects to the quadrature calibrated oscillator circuit 500 illustrated in FIG. 5. In some implementations, the free-running frequency of the ILO 1000 may be digitally tuned using the equivalent of the frequency tuning and control circuit 514 as illustrated in FIG. 5, and may include an analog quadrature calibration circuit 504 as illustrated in FIG. 5. The ILO 1000 may be calibrated to have an operating frequency or free-running frequency that is locked using four phases of an injected input clock signal 1030. In the illustrated example, the in-phase differential injection signal 1018 and the quadrature differential injection signal 1028 are injected into the ILO 1000. The injection phase generation circuit 1040 may generate the quadrature differential injection signal 1028 by delaying the in-phase differential injection signal 1018 using a tunable delay circuit 1026. The tunable delay circuit 1026 may be configured during initial calibration to minimize or eliminate phase errors between the in-phase differential injection signal 1018 and the quadrature differential injection signal 1028. The tunable delay circuit 1026 may be configured during operation to correct for phase drifts between the in-phase output signal 1016 and the quadrature output signal 1014. The initial calibration may ensure that the duty cycles of the in-phase output signal 1016 and the quadrature output signal 1014 do not vary from 50% by more than a predefined maximum duty cycle error. The initial calibration may control noise rejection bandwidth and phase errors occurring between the in-phase output signal 1016 and quadrature output signal 1014 signal.

The ILO 1000 includes voltage control circuits $1002_p$, $1002_n$, $1004_p$ and $1004_n$ that couple the power supply inputs of corresponding delay elements $1006_p$, $1006_n$, $1008_p$ and $1008_n$ to a global power supply 1020. For the purposes of this description, the term "global power supply" refers to a power supply that has a calibrated voltage and that is used to power delay elements within the ILO 1000. In the illustrated example, the voltage of the global power supply 1020 is calibrated and/or controlled by a finite state machine 1010, and may be tuned during initial system calibration to obtain a desired free-running frequency of the ILO 1000 and/or an acceptable duty cycle of the in-phase output signal 1016 and the quadrature output signal 1014. In the illustrated example, the finite state machine 1010 provides multibit codewords 1022, 1024 that define the voltage drop across each of the voltage control circuits $1002_p$, $1002_n$, $1004_p$ and $1004_n$. The finite state machine 1010 may configure the multibit codewords 1022, 1024 based on signaling 1038 provided by duty cycle and phase comparators circuit 1012. The duty cycle and phase comparators circuit 1012 may be configured to monitor and/or measure characteristics of the in-phase output signal 1016 and quadrature output signal 1014 that can be used to determine phase relationships and duty cycles between and within the in-phase output signal 1016 and quadrature output signal 1014.

In some implementations, the duty cycle and phase comparators circuit 1012 and the finite state machine 1010 cooperate to measure the elapsed time between edges in the in-phase output signal 1016 and quadrature output signal 1014. In one example, elapsed time information may indicate the phase relationship of the edges in the in-phase output signal 1016 and quadrature output signal 1014 with respect to an edge in the in-phase output signal 1016, for instance. In another example, elapsed time information may provide sufficient information to calculate the duty cycles of the in-phase output signal 1016 and quadrature output signal 1014 or a variation from a 50% duty cycle in the in-phase output signal 1016 and quadrature output signal 1014.

In some implementations, the finite state machine 1010 may adjust the phase relationship between the in-phase differential injection signal 1018 and the quadrature differential injection signal 1028. The finite state machine 1010 may provide a codeword 1036 or other signaling that controls the operation of the tunable delay circuit 1026. The finite state machine 1010 may adjust the delay between edges in the in-phase and quadrature versions of the input clock signal 1030 by incrementing or decrementing a value of the codeword 1036. In some implementations, the finite state machine 1010 may adjust the delay between in-phase and quadrature versions of the input clock signal 1030 by selecting values for the codeword 1036 from a lookup table that may be indexed based on information provided in the signaling 1038 obtained from the duty cycle and phase comparators circuit 1012 or from other phase detection circuits. The injection of four phases of the input clock signal 1030 can suppress errors or variances in the phase relationship between the in-phase output signal 1016 and quadrature output signal 1014 by eliminating or minimizing phase errors in the four phases of the input clock signal 1030.

In some implementations, the finite state machine 1010 may adjust phases or duty cycles associated with the in-phase output signal 1016 and quadrature output signal 1014 by incrementing or decrementing a value of one or more of the multibit codewords 1022, 1024. In some implementations, the finite state machine 1010 may adjust phases or duty cycles associated with the in-phase output signal 1016 and quadrature output signal 1014 by selecting values for one or more of the multibit codewords 1022, 1024 from a lookup table that may be indexed based on information provided in the signaling 1038 obtained from the duty cycle and phase comparators circuit 1012.

In some implementations, the finite state machine 1010 may monitor or control the voltage of the global power supply 1020. Local supplies may be configured and/or provided for each of a group of delay elements provided in the ILO 1000. In the example illustrated in FIG. 10, a group of four delay elements $1006_p$, $1006_n$, $1008_p$, $1008_n$ receive power from the global power supply 1020 through the voltage control circuits $1002_p$, $1002_n$, $1004_p$ and $1004_n$, while other delay elements receive power directly from the global power supply 1020. In other examples, each delay element provided in the ILO 1000 receives independent localized power from the global power supply 1020 through a corresponding voltage control circuit, enabling maximum control over phase and duty cycle. The finite state machine 1010 may be configured to control the voltage drops provided by voltage control circuits, including voltage control circuits $1002_p$, $1002_n$, $1004_p$ and $1004_n$, to correct systematic duty cycle errors in clock signals produced by the ILO 1000 and/or to correct phase mismatches within the ILO 1000.

In the example illustrated in FIG. 10, the core circuits of the ILO 1000 can be used to control the free-running frequency of the ILO 1000 and to define noise rejection bandwidth of the ILO 1000. Phase errors occurring between the in-phase differential injection signal 1018 and the quadrature differential injection signal 1028 can be controlled using the tunable delay circuit 1026. The tunable delay circuit 1026 may be configured to correct for phase drifts between the in-phase output signal 1016 and the quadrature output signal 1014 during operation and thereby maintain the calibrated phase relationship between in-phase output signal 1016 and the quadrature output signal 1014. The finite state machine 1010 may control or adjust the delay provided by the tunable delay circuit 1026 to compensate for any remaining systematic phase mismatch in the ILO 1000.

The ILO 1000 receives four injection phases that are provided as an in-phase differential injection signal 1018 and a quadrature differential injection signal 1028. In other examples, a different number of injection phases can be provided to the ILO 1000. The number of injection phases provided to the ILO 1000 may be determined based on application requirements. In one example, the number of injection phases provided to the ILO 1000 may be selected based on the magnitude and distribution of delay element mismatches within the ILO 1000. In another example, the number of injection phases provided to the ILO 1000 may be selected to facilitate duty cycle calibration.

Figure 11:
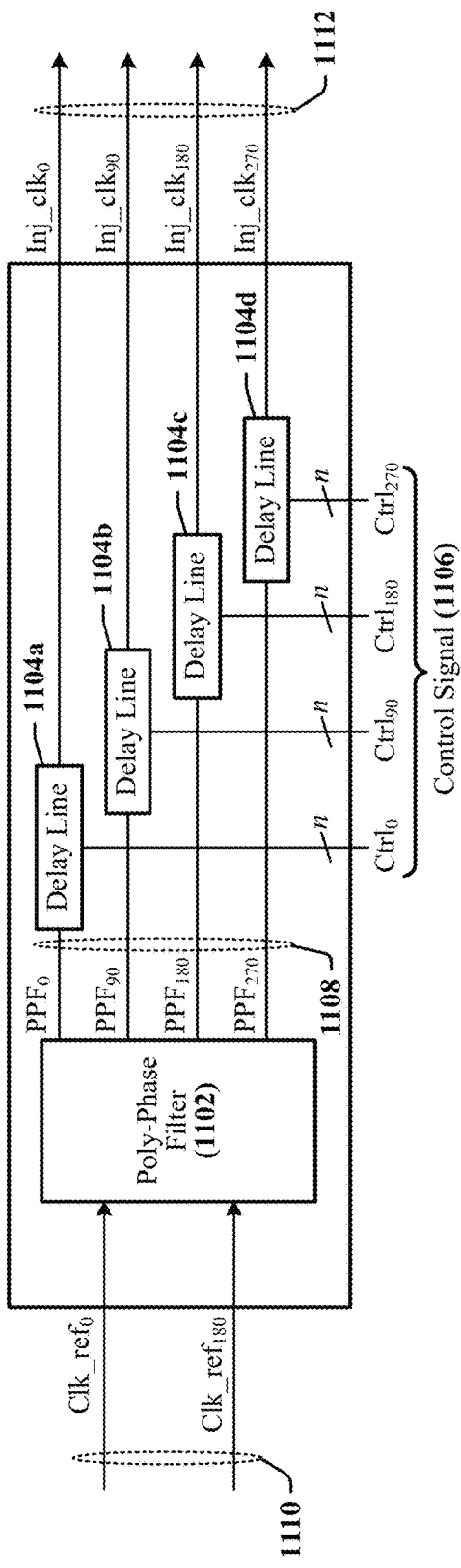
FIG. 11 illustrates examples of injection phase generation circuits that may be used in the ILO illustrated in FIG. 10.
Figure 11:
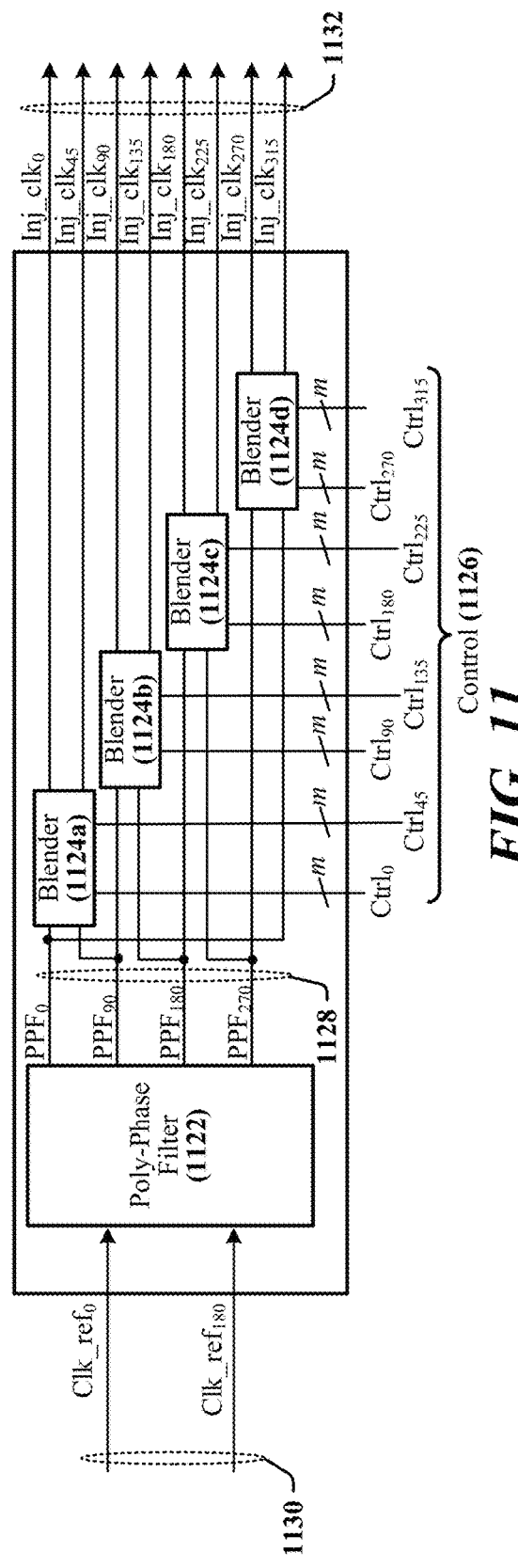

FIG. 11 illustrates examples of injection phase generation circuits 1100, 1120 that may be used as alternatives to the tunable delay circuit 1026 illustrated in FIG. 10. The injection phase generation circuits 1100, 1120 can generate a variety of injection phases that can be used for injection locking the ILO 1000 illustrated in FIG. 10. Each of the injection phase generation circuits 1100, 1120 may be used to correct for phase drifts between the in-phase output signal 1016 and the quadrature output signal 1014 during operation and thereby maintain the calibrated phase relationship between in-phase output signal 1016 and the quadrature output signal 1014. The finite state machine 1010 may control or adjust delays that define the phase of each of injection phase provided to the ILO 1000.

The first injection phase generation circuit 1100 includes a poly-phase filter (the PPF 1102) and multiple delay lines 1104a-1104d. The PPF 1102 receives a reference clock signal 1110 at a differential input and outputs four phase signals (the PPF phase signals 1108) with respective phase angles of 0°, 90°, 180° and 270°. Each of the PPF phase signals 1108 is provided to a corresponding delay line 1104a, 1104b, 1104c, 1104d that outputs a selectively delayed version of its input signal. Each of the delay lines 1104a-1104d receives a portion of a multibit control signal 1106 received from a controller. In the example illustrated in FIG. 10, the controller functions may be implemented using the finite state machine 1010. The controller may configure the delay duration provided by each of the delay lines 1104a-1104d independently such that the combination of delays provided by the delay lines 1104a-1104d produces output injection clock signals 1112 with desired phase separations. In one example, the desired phase separations may correspond to the phase relationships required to produce in-phase and quadrature output injection clock signals 1112 without phase errors. In another example, the desired phase separations may produce one or more phases that include a phase correction. Phase corrections may be introduced to offset residual phase errors in the output signals of the ILO 1000.

The second injection phase generation circuit 1120 includes a poly-phase filter 1122 and multiple phase blending circuits 1124a-1124d. The poly-phase filter 1122 receives a reference clock signal 1130 at a differential input and outputs four phase signals (the PPF phase signals 1128) with respective phase angles of 0°, 90°, 180° and 270°. The phase blending circuits 1124a-1124d may also be referred to as phase interpolators or phase interpolation circuits. A pair of the PPF phase signals 1128 is provided to each phase blending circuit 1124a, 1124b, 1124c, 1124d that outputs a selectively blended version of its input signals. The phase of the signals in each pair of the PPF phase signals 1128 is separated by a 90° phase angle. Each phase blending circuit 1124a, 1124b, 1124c, 1124d mixes its input signals by effectively performing a weighted addition of the input signals. The weights applied to each signal in the pair are determined by a portion of a multibit control signal 1126 received from a controller. In one example, the portion of a multibit control signal 1126 includes two values that indicate respective weights to be applied to the pair of the corresponding PPF phase signals 1128.

In the example illustrated in FIG. 10, the controller functions may be implemented using the finite state machine 1010. The controller may configure the weights applied by each of the phase blending circuits 1124a, 1124b, 1124c, 1124d independently such that the phase blending circuits 1124a, 1124b, 1124c, 1124d produce output injection clock signals 1132 with desired phase separations. In one example, the desired phase separations may correspond to the phase relationships required to produce in-phase and quadrature injection clock signals without phase errors. In another example, the desired phase separations may produce one or more phases that include a phase correction. Phase corrections may be introduced to offset residual phase errors in the output signals of the ILO 1000.

The injection phase generation circuits 1100, 1120 may be configured during initial calibration to minimize or eliminate phase errors between the in-phase differential injection signal 1018 and the quadrature differential injection signal

1028. The injection phase generation circuits 1100, 1120 may be configured during operation to correct for phase drifts or differences between the in-phase output signal 1016 and the quadrature output signal 1014.

Figure 12:
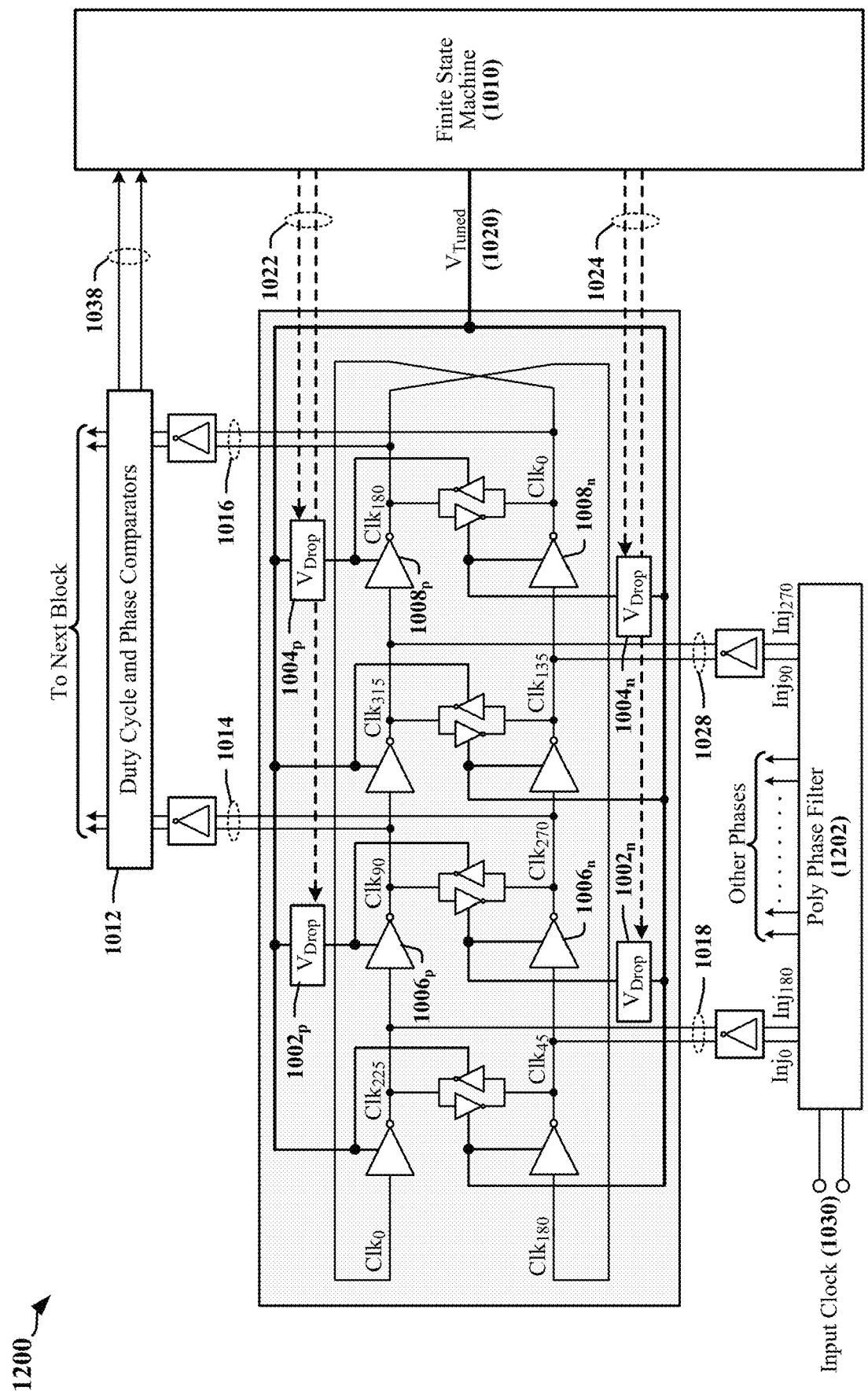
FIG. 12 illustrates a third example of an ILO that supports quadrature calibration and dynamic run-time recalibration in accordance with certain aspects of this disclosure.

FIG. 12 illustrates a third example of an ILO 1200 that supports quadrature calibration and dynamic run-time recalibration in accordance with certain aspects of this disclosure. The ILO 1200 may be configured to operate substantially in the same manner as the ILO 1000 illustrated in FIG. 10. In this example, the ILO 1200 receives multiple injection phases from a poly-phase filter 1202. The poly-phase filter 1202 may be implemented using resistor-capacitor (RC) networks. The poly-phase filter 1202 may be configured to produce a desired number of injection phases to be used for injection locking the ILO 1200. In one example, the poly-phase filter 1202 may be configured to generate four injection phases. In another example, the poly-phase filter 1202 may be configured to generate eight injection phases. In some instances, the poly-phase filter 1202 includes cascaded poly-phase filter stages configured to generate eight or sixteen injection phases.

The poly-phase filter 1202 can produce a desired number of injection phases while consuming less power than other phase generating circuits, including delay-locked loops for example. In some implementations, the benefits obtained from multi-phase injection can outweigh deficiencies in tuning capability of the PPF 1102.

Figure 13:
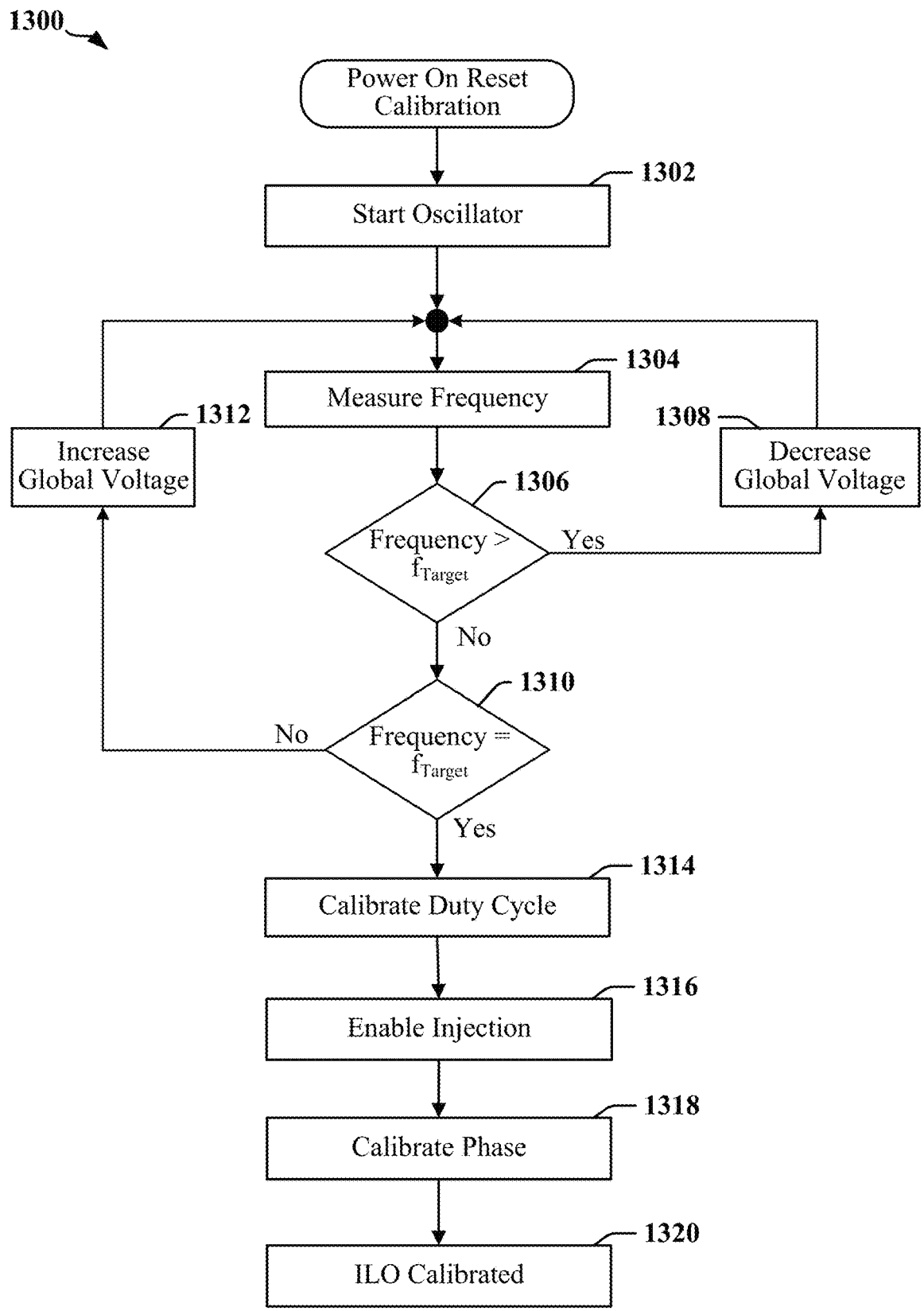
FIG. 13 is a flowchart illustrating an example of initial calibration in an ILO according to certain aspects of this disclosure.

FIG. 13 is a flowchart 1300 that illustrates an example of an initial calibration procedure for an injection-locked ring oscillator that is configured in accordance with certain aspects of this disclosure. The initial calibration procedure may be initiated after a power on or reset event. At block 1302, the injection-locked ring oscillator is enabled and clock signal generation is started. At block 1304, the frequency of the generated clock signal is measured. At block 1306, it may be determined whether the measured frequency exceeds a target frequency ($f_{Target}$) defined for the injection-locked ring oscillator. If the measured frequency is determined at block 1306 to be greater than the target frequency, then the voltage of the global power supply in the injection-locked ring oscillator is reduced by a step value at block 1308 and the procedure returns to block 1304. Reducing the voltage of the global power decreases the frequency of the clock signal generated by the injection-locked ring oscillator. If it is determined at block 1306 that the measured frequency is not greater than the target frequency, then the procedure proceeds to block 1310.

At block 1310, it may be determined whether the measured frequency is substantially equal to the target frequency defined for the injection-locked ring oscillator. Here, the measured frequency may be substantially equal to the target frequency if the difference between the measured frequency and the target frequency lies within a tolerance range defined by specification or protocol. A measured frequency that is substantially equal to the target frequency may be said to match the target frequency. If the measured frequency is determined at block 1310 to not be substantially equal to the target frequency, then the voltage of the global power supply in the injection-locked ring oscillator is increased by a step value at block 1312 and the procedure returns to block 1304. Increasing the voltage of the global power increases the frequency of the clock signal generated by the injection-locked ring oscillator. If it is determined at block 1310 that the measured frequency is substantially equal to the target frequency, then the procedure proceeds to block 1314.

Figure 14:
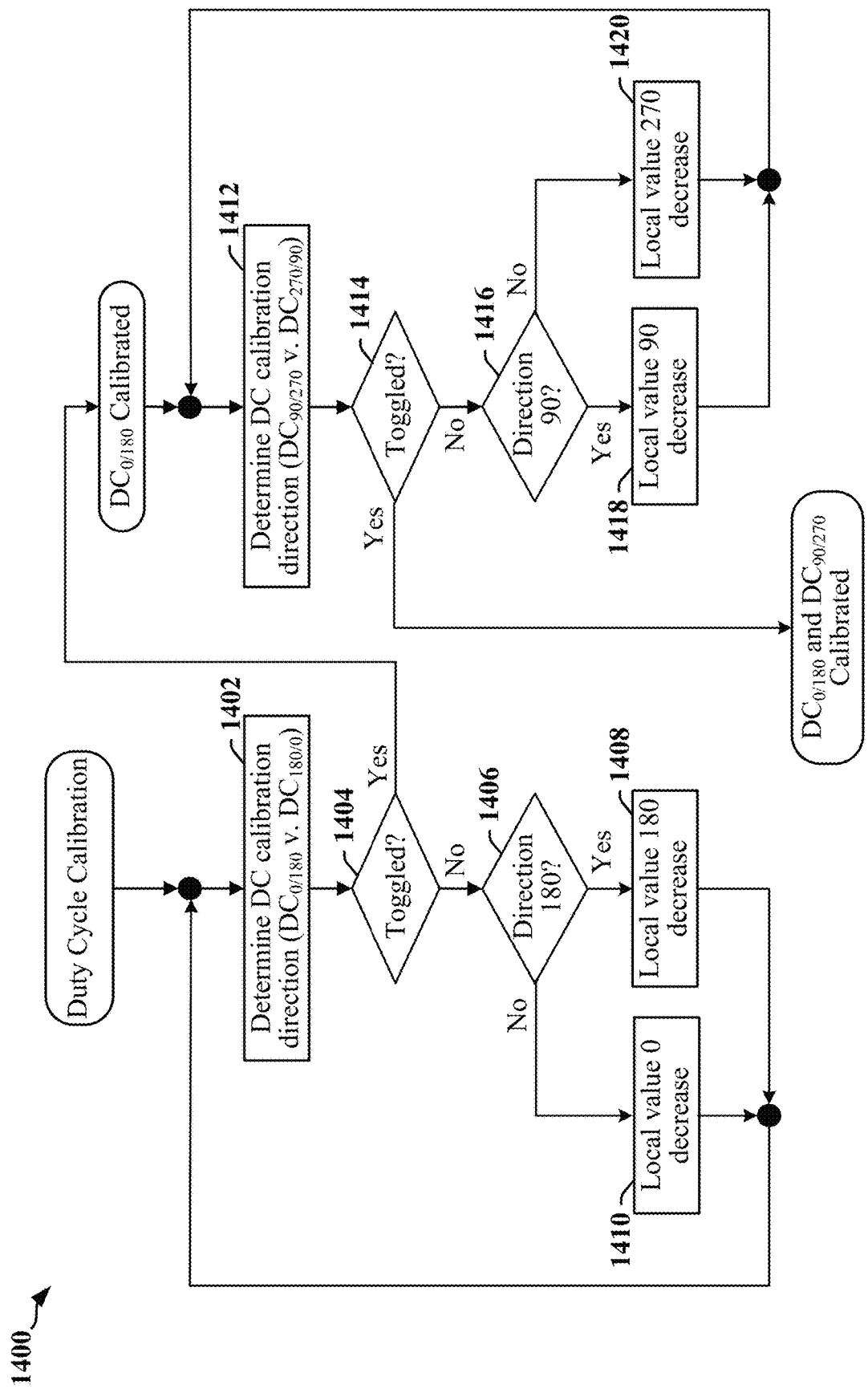
FIG. 14 is a flowchart illustrating an example of duty cycle calibration of an ILO according to certain aspects of this disclosure.
Figure 15:
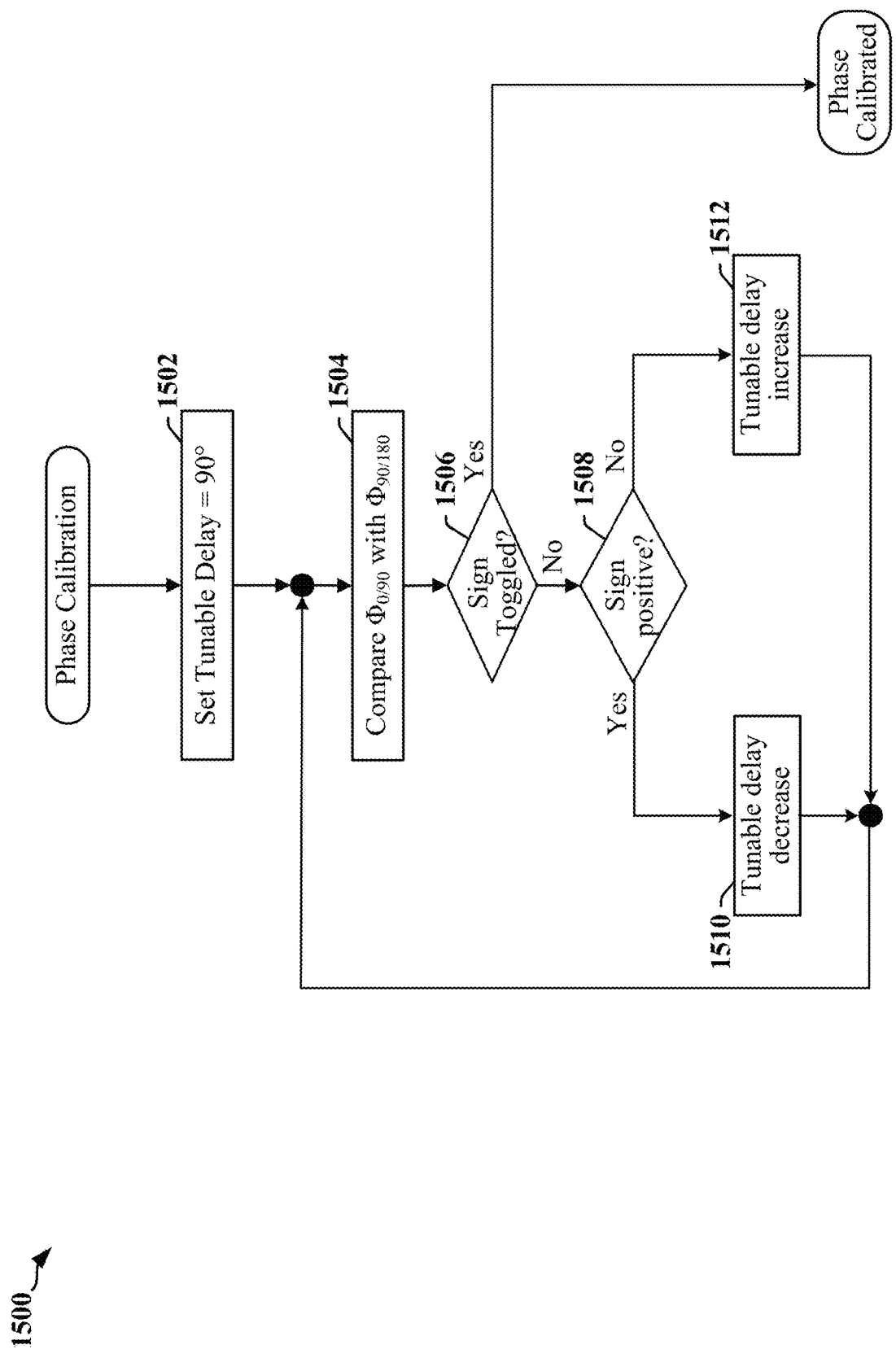
FIG. 15 is a flowchart illustrating an example of phase calibration of an ILO according to certain aspects of this disclosure.

At block 1314, the frequency of the generated clock signal is substantially equal to the target frequency and duty cycle calibration may be performed. An example of duty cycle calibration is illustrated in FIG. 14. After duty cycle has been calibrated, Injection locking may be enabled at block 1316. At block 1318, the phase of the generated clock signal may be calibrated. An example of phase calibration is illustrated in FIG. 15. After phase calibration has been completed, the injection-locked ring oscillator is considered to be calibrated at block 1320.

FIG. 14 is a flowchart 1400 that illustrates an example of a duty cycle calibration procedure for an injection-locked ring oscillator that is configured in accordance with certain aspects of this disclosure. In some instances, the duty cycle calibration procedure is initiated during an initial calibration procedure.

At block 1402, the duty cycle of the clock signal generated by the injection-locked ring oscillator may be determined. A duty cycle that is not sufficiently equal to 50% may be indicated has having one of two calibration directions, where calibration direction indicates whether the duration between the 0° edge and the next 180° edge (see FIG. 7) is to be reduced or the duration between the 180° edge and the next 0° edge is to be reduced. Here, the duty cycle may be considered to be sufficiently equal to 50% if the duty cycle lies within a tolerance range defined by specification or protocol. At block 1404, it is determined whether the calibration direction has changed (toggled) since the previous iteration of the 0°/180° duty cycle calibration loop. If it is determined at block 1404 that the calibration direction has not changed, then the procedure proceeds to block 1406. At block 1406, it is determined whether the duration between the 180° edge and the next 0° edge is to be reduced. If it is determined at block 1406 that the duration between the 180° edge and the next 0° edge is to be reduced, then at block 1408 the voltage control circuits associated with the duration between the 180° edge and the next 0° edge may be increased and the procedure then returns to block 1402. If it is determined at block 1406 that the duration between the 0° edge and the next 180° edge is to be reduced, then at block 1410 the voltage control circuits associated with the duration between the 0° edge and the next 180° edge may be increased and the procedure then returns to block 1402.

If it is determined at block 1404 that the calibration direction has changed, then the 0°/180° duty cycle calibration is considered complete and the procedure proceeds to block 1412.

At block 1412, the duty cycle of the clock signal generated by the injection-locked ring oscillator may be determined. A duty cycle that is not sufficiently equal to 50% may be indicated has having one of two calibration directions, where calibration direction indicates whether the duration between the 90° edge and the next 270° edge is to be reduced or the duration between the 270° edge and the next 90° edge is to be reduced. At block 1414, it is determined whether the calibration direction has changed (toggled) since the previous iteration of the 90°/270° duty cycle calibration loop. If it is determined at block 1414 that the calibration direction has not changed, then the procedure proceeds to block 1416. At block 1416, it is determined whether the duration between the 270° edge and the next 90° edge is to be reduced. If it is determined at block 1416 that the duration between the 270° edge and the next 90° edge is to be reduced, then at block 1418 the voltage control circuits associated with the duration between the 270° edge and the next 90° edge may be increased and the procedure then returns to block 1412. If it is determined at block 1416 that the duration between the 90° edge and the next 270° edge is to be reduced, then at block 1420 the voltage control circuits associated with the duration between the 90° edge and the next 270° edge may be increased and the procedure then returns to block 1412.

If it is determined at block 1414 that the calibration direction has changed, then the 0°/180° duty cycle calibration and the 90°/270° duty cycle calibration are considered complete and the procedure terminates.

FIG. 15 is a flowchart 1500 that illustrates an example of a phase calibration procedure for an injection-locked ring oscillator that is configured in accordance with certain aspects of this disclosure. In some instances, the phase calibration procedure is initiated during an initial calibration procedure. In one example, the phase calibration procedure involves iteratively reconfiguring the tunable delay circuit 1026 shown in FIG. 10.

At block 1502, the tunable delay circuit 1026 is configured to provide a 90° phase angle between the in-phase differential injection signal 1018 and the quadrature differential injection signal 1028. At block 1504, the phase angle ($\Phi_{0/90}$) between the 0° and 90° phases is compared with the phase angle ($\Phi_{90/180}$) between the 90° and 180° phases. In one example, the comparison may be performed by subtracting the phase angle between the 90° and 180° phases from the phase angle between the 0° and 90° phases ($\Phi_{0/90}-\Phi_{90/180}$). In another example, the comparison may be performed by subtracting the phase angle between the 0° and 90° phases from the phase angle between the 90° and 180° phases ($\Phi_{90/180}-\Phi_{0/90}$). At block 1506, it may be determined whether the sign of the difference in phase angle has changed (toggled) since the previous iteration of the phase calibration procedure. If it is determined at block 1506 that the sign of the difference in phase angle has not changed, then the procedure proceeds to block 1508. At block 1508, it may be determined whether the sign of the difference in phase angle is positive. If it is determined at block 1508 that the sign of the difference in phase angle is positive then the tunable delay circuit 1026 is reconfigured at block 1510 to provide a reduced delay and the procedure returns to block 1504. If it is determined at block 1508 that the sign of the difference in phase angle is negative then the tunable delay circuit 1026 is reconfigured at block 1512 to provide an increased delay and the procedure returns to block 1504.

If it is determined at block 1506 that the sign of the output phase error has changed, then the phase is considered to have been calibrated and the phase calibration procedure terminates.

The operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus includes means for measuring a frequency of a clock signal generated by an injection-locked ring oscillator, means for determining whether the measured frequency matches to a target frequency defined for the injection-locked ring oscillator, means for adjusting a voltage drop across two or more voltage control circuits when the measured frequency does not match the target frequency, and a controller configured to calibrate a duty cycle or phase associated with in-phase and quadrature outputs of the injection-locked oscillator when the measured frequency matches the target frequency. Each voltage control circuit couples a delay element of the injection-locked oscillator to a global power supply.

In one example, at least two delay elements of the injection-locked oscillator are directly coupled to the global power supply. In some examples, the controller is further configured to provide a multibit control signal to each of the two or more voltage control circuits. The multibit control signal may be configured based on a phase difference between the in-phase and quadrature outputs determined by a phase comparator coupled to the in-phase and quadrature outputs of the injection-locked oscillator. The controller may be further configured to provide a multibit control signal to each of the two or more voltage control circuits. The multibit control signal may be configured based on an indication of a duty cycle associated with the in-phase and quadrature outputs. The indication may be received in a signal provided by a phase comparator coupled to the in-phase and quadrature outputs of the injection-locked oscillator received from the phase comparator.

In certain examples, the apparatus includes means for generating a plurality of injection clock signals from a reference clock signal. In some implementations, the means for generating the plurality of injection clock signals includes a delay circuit that provides two or more of the plurality of injection clock signals by delaying the reference clock signal by a duration configured by the controller. In some implementations, the means for generating the plurality of injection clock signals includes a poly-phase filter. In some implementations, the means for generating the plurality of injection clock signals includes one or more phase interpolators.

In some examples, the controller is further configured to calibrate the global power supply to obtain a desired free-running frequency for the in-phase and quadrature outputs.

Some implementation examples are described in the following numbered clauses:

1. An injection-locked oscillator, comprising: a plurality of delay elements connected in a loop and coupled to a global power supply, having an input driven by a preceding stage and an output that drives a next stage; two or more voltage control circuits, each voltage control circuit coupling one of the plurality of delay elements to the global power supply; a phase comparator coupled to in-phase and quadrature outputs of the injection-locked oscillator; and a controller coupled to an output of the phase comparator, the controller being configured to drive control inputs of the two or more voltage control circuits, the control input of each voltage control circuit determining a level of a voltage drop across the each voltage control circuit.
2. The injection-locked oscillator as described in clause 1, wherein at least two delay elements of the plurality of delay elements are directly coupled to the global power supply.
3. The injection-locked oscillator as described in clause 1 or clause 2, wherein the controller is further configured to: provide a multibit control signal to each of the two or more voltage control circuits, the multibit control signal being configured based on a phase difference between the in-phase and quadrature outputs determined by the phase comparator.
4. The injection-locked oscillator as described in any of clauses 1-3, wherein the controller is further configured to: provide a multibit control signal to each of the two or more voltage control circuits, the multibit control signal being configured based on an input received from the phase comparator indicating a duty cycle associated with the in-phase and quadrature outputs.
5. The injection-locked oscillator as described in any of clauses 1-4, further comprising: an injection phase generation circuit configured to generate a plurality of injection clock signals from a reference clock signal.
6. The injection-locked oscillator as described in clause 5, wherein the injection phase generation circuit comprises a delay circuit that provides two or more of the plurality of injection clock signals by delaying the reference clock signal by a duration configured by the controller.
7. The injection-locked oscillator as described in clause 5, wherein the injection phase generation circuit comprises a poly-phase filter that provides the plurality of injection clock signals.
8. The injection-locked oscillator as described in clause 5, wherein the injection phase generation circuit comprises a poly-phase filter and one or more phase interpolators.
9. The injection-locked oscillator as described in any of clauses 1-8, wherein the controller is further configured to: calibrate the global power supply to obtain a desired free-running frequency for the in-phase and quadrature outputs.
10. An apparatus, comprising: means for measuring a frequency of a clock signal generated by an injection-locked ring oscillator; means for determining whether the measured frequency matches to a target frequency defined for the injection-locked ring oscillator; means for adjusting a voltage drop across two or more voltage control circuits when the measured frequency does not match the target frequency, wherein each voltage control circuit couples a delay element of the injection-locked oscillator to a global power supply; and a controller configured to calibrate a duty cycle or phase associated with in-phase and quadrature outputs of the injection-locked oscillator when the measured frequency matches the target frequency.
11. The apparatus as described in clause 10, wherein at least two delay elements of the injection-locked oscillator are directly coupled to the global power supply.
12. The apparatus as described in clause 10 or clause 11, wherein the controller is further configured to: provide a multibit control signal to each of the two or more voltage control circuits, the multibit control signal being configured based on a phase difference between the in-phase and quadrature outputs determined by a phase comparator coupled to the in-phase and quadrature outputs of the injection-locked oscillator.
13. The apparatus as described in any of clauses 10-12, wherein the controller is further configured to: provide a multibit control signal to each of the two or more voltage control circuits, the multibit control signal being configured based on an indication of a duty cycle associated with the in-phase and quadrature outputs, wherein the indication is received in a signal provided by a phase comparator coupled to the in-phase and quadrature outputs of the injection-locked oscillator received from the phase comparator.
14. The apparatus as described in any of clauses 10-13, further comprising: means for generating a plurality of injection clock signals from a reference clock signal.
15. The apparatus as described in clause 14, wherein the means for generating the plurality of injection clock signals comprises: a delay circuit that provides two or more of the plurality of injection clock signals by delaying the reference clock signal by a duration configured by the controller.
16. The apparatus as described in clause 14, wherein the means for generating the plurality of injection clock signals comprises: a poly-phase filter.
17. The apparatus as described in clause 16, wherein the means for generating the plurality of injection clock signals comprises: one or more phase interpolators.
18. The apparatus as described in any of clauses 10-17, wherein the controller is further configured to: calibrate the global power supply to obtain a desired free-running frequency for the in-phase and quadrature outputs.
19. A method for calibrating an injection-locked oscillator, comprising: measuring a frequency of a clock signal generated by the injection-locked oscillator; determining whether the measured frequency matches to a target frequency defined for the injection-locked ring oscillator; adjusting a voltage drop across two or more voltage control circuits when the measured frequency does not match the target frequency, wherein each voltage control circuit couples a delay element of the injection-locked oscillator to a global power supply; and calibrating a duty cycle or phase associated with in-phase and quadrature outputs of the injection-locked oscillator when the measured frequency matches the target frequency.
20. The method as described in clause 19, wherein at least two delay elements of the injection-locked oscillator are directly coupled to the global power supply.
21. The method as described in clause 19 or clause 20, further comprising: providing a multibit control signal to each of the two or more voltage control circuits, the multibit control signal being configured based on a phase difference between the in-phase and quadrature outputs determined by a phase comparator coupled to the in-phase and quadrature outputs of the injection-locked oscillator.
22. The method as described in any of clauses 19-21, further comprising: providing a multibit control signal to each of the two or more voltage control circuits, the multibit control signal being configured based on an indication of a duty cycle associated with the in-phase and quadrature outputs, wherein the indication is received in a signal provided by a phase comparator coupled to the in-phase and quadrature outputs of the injection-locked oscillator received from the phase comparator.

23. The method as described in any of clauses 19-22, further comprising: generating a plurality of injection clock signals from a reference clock signal.
24. The method as described in clause 23, wherein generating the plurality of injection clock signals comprises: delaying the reference clock signal by a duration configured to provide a desired phase angle between two or more of the plurality of injection clock signals.
25. The method as described in clause 23, wherein generating the plurality of injection clock signals comprises: using a poly-phase filter to generate the plurality of injection clock signals.
26. The method as described in clause 25, wherein generating the plurality of injection clock signals comprises: using one or more phase interpolators to generate the plurality of injection clock signals.
27. The method as described in any of clauses 19-26, further comprising: calibrating the global power supply to obtain a desired free-running frequency for the in-phase and quadrature outputs.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An injection-locked oscillator, comprising:
    a plurality of delay elements connected in a loop and coupled to a global power supply, each delay element having an input that is driven by a preceding stage and an output that drives a next stage;
    two or more voltage control circuits, each voltage control circuit coupling one of the plurality of delay elements to the global power supply;
    a phase comparator coupled to in-phase and quadrature outputs of the injection-locked oscillator; and
    a controller coupled to an output of the phase comparator, the controller being configured to drive control inputs of the two or more voltage control circuits, the control input of each voltage control circuit determining a level of a voltage drop across the each voltage control circuit.
2. The injection-locked oscillator of claim 1, wherein at least two delay elements of the plurality of delay elements are directly coupled to the global power supply.
3. The injection-locked oscillator of claim 1, wherein the controller is further configured to:
    provide a multibit control signal to each of the two or more voltage control circuits, the multibit control signal being configured based on a phase difference between the in-phase and quadrature outputs determined by the phase comparator.
4. The injection-locked oscillator of claim 1, wherein the controller is further configured to:
    provide a multibit control signal to each of the two or more voltage control circuits, the multibit control signal being configured based on an input received from the phase comparator indicating a duty cycle associated with the in-phase and quadrature outputs.
5. The injection-locked oscillator of claim 1, further comprising:
    an injection phase generation circuit configured to generate a plurality of injection clock signals from a reference clock signal.
6. The injection-locked oscillator of claim 5, wherein the injection phase generation circuit comprises a delay circuit that provides two or more of the plurality of injection clock signals by delaying the reference clock signal by a duration configured by the controller.
7. The injection-locked oscillator of claim 5, wherein the injection phase generation circuit comprises a poly-phase filter that provides the plurality of injection clock signals.
8. The injection-locked oscillator of claim 5, wherein the injection phase generation circuit comprises a poly-phase filter and one or more phase interpolators.
9. The injection-locked oscillator of claim 1, wherein the controller is further configured to:
    calibrate the global power supply to obtain a desired free-running frequency for the in-phase and quadrature outputs.
10. An apparatus, comprising:
    means for measuring a frequency of a clock signal generated by an injection-locked ring oscillator;
    means for determining whether the measured frequency matches to a target frequency defined for the injection-locked ring oscillator;
    means for adjusting a voltage drop across two or more voltage control circuits when the measured frequency does not match the target frequency, wherein each voltage control circuit couples a delay element of the injection-locked oscillator to a global power supply; and
    a controller configured to calibrate a duty cycle or phase associated with in-phase and quadrature outputs of the injection-locked oscillator when the measured frequency matches the target frequency.
11. The apparatus of claim 10, wherein at least two delay elements of the injection-locked oscillator are directly coupled to the global power supply.
12. The apparatus of claim 10, wherein the controller is further configured to:
    provide a multibit control signal to each of the two or more voltage control circuits, the multibit control signal being configured based on a phase difference between the in-phase and quadrature outputs determined by a phase comparator coupled to the in-phase and quadrature outputs of the injection-locked oscillator.
13. The apparatus of claim 10, wherein the controller is further configured to:
    provide a multibit control signal to each of the two or more voltage control circuits, the multibit control signal being configured based on an indication of a duty cycle associated with the in-phase and quadrature outputs, wherein the indication is received in a signal provided by a phase comparator coupled to the in-phase and quadrature outputs of the injection-locked oscillator received from the phase comparator.
14. The apparatus of claim 10, further comprising:
    means for generating a plurality of injection clock signals from a reference clock signal.
15. The apparatus of claim 14, wherein the means for generating the plurality of injection clock signals comprises:

a delay circuit that provides two or more of the plurality of injection clock signals by delaying the reference clock signal by a duration configured by the controller.

16. The apparatus of claim 14, wherein the means for generating the plurality of injection clock signals comprises a poly-phase filter.

17. The apparatus of claim 16, wherein the means for generating the plurality of injection clock signals comprises one or more phase interpolators.

18. The apparatus of claim 10, wherein the controller is further configured to:
calibrate the global power supply to obtain a desired free-running frequency for the in-phase and quadrature outputs.

19. A method for calibrating an injection-locked oscillator, comprising:
measuring a frequency of a clock signal generated by the injection-locked oscillator;
determining whether the measured frequency matches to a target frequency defined for the injection-locked ring oscillator;
adjusting a voltage drop across two or more voltage control circuits when the measured frequency does not match the target frequency, wherein each voltage control circuit couples a delay element of the injection-locked oscillator to a global power supply; and
calibrating a duty cycle or phase associated with in-phase and quadrature outputs of the injection-locked oscillator when the measured frequency matches the target frequency.

20. The method of claim 19, wherein at least two delay elements of the injection-locked oscillator are directly coupled to the global power supply.

21. The method of claim 19, further comprising:
providing a multibit control signal to each of the two or more voltage control circuits, the multibit control signal being configured based on a phase difference between the in-phase and quadrature outputs determined by a phase comparator coupled to the in-phase and quadrature outputs of the injection-locked oscillator.

22. The method of claim 19, further comprising:
providing a multibit control signal to each of the two or more voltage control circuits, the multibit control signal being configured based on an indication of a duty cycle associated with the in-phase and quadrature outputs, wherein the indication is received in a signal provided by a phase comparator coupled to the in-phase and quadrature outputs of the injection-locked oscillator received from the phase comparator.

23. The method of claim 19, further comprising:
generating a plurality of injection clock signals from a reference clock signal.

24. The method of claim 23, wherein generating the plurality of injection clock signals comprises:
delaying the reference clock signal by a duration configured to provide a desired phase angle between two or more of the plurality of injection clock signals.

25. The method of claim 23, wherein generating the plurality of injection clock signals comprises:
using a poly-phase filter to generate the plurality of injection clock signals.

26. The method of claim 25, wherein generating the plurality of injection clock signals comprises:
using one or more phase interpolators to generate the plurality of injection clock signals.

27. The method of claim 19, further comprising:
calibrating the global power supply to obtain a desired free-running frequency for the in-phase and quadrature outputs.

* * * * *